(12) United States Patent
Fujikawa

(10) Patent No.: US 11,107,442 B2
(45) Date of Patent: Aug. 31, 2021

(54) ELECTRO-OPTICAL DEVICE, DRIVING METHOD FOR ELECTRO-OPTICAL DEVICE, AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 50 days.

(21) Appl. No.: 16/420,830

(22) Filed: May 23, 2019

(65) Prior Publication Data

US 2019/0362689 A1 Nov. 28, 2019

(30) Foreign Application Priority Data

May 24, 2018 (JP) .............................. JP2018-099761
Mar. 27, 2019 (JP) .............................. JP2019-060071

(51) Int. Cl.
*H01L 25/16* (2006.01)
*G09G 5/12* (2006.01)

(52) U.S. Cl.
CPC ............. *G09G 5/12* (2013.01); *H01L 25/167* (2013.01); *G09G 2310/027* (2013.01); *G09G 2310/0218* (2013.01)

(58) Field of Classification Search
CPC ... G09G 5/12; G09G 3/32; G09G 3/36; H01L 25/167
See application file for complete search history.

(56) References Cited

U.S. PATENT DOCUMENTS

| | | | |
|---|---|---|---|
| 6,266,039 B1 | 7/2001 | Aoki | |
| 6,731,266 B1 | 5/2004 | Jung | |
| 2001/0033261 A1* | 10/2001 | Washio | ................ G09G 3/3685 345/87 |
| 2002/0041267 A1 | 4/2002 | Jung | |
| 2005/0200582 A1 | 9/2005 | Goto et al. | |
| 2007/0236435 A1 | 10/2007 | Miyazaki et al. | |
| 2010/0045638 A1 | 2/2010 | Cho et al. | |
| 2015/0154926 A1 | 6/2015 | Fujikawa | |

(Continued)

FOREIGN PATENT DOCUMENTS

| | | | |
|---|---|---|---|
| JP | 2000-089194 A | 3/2000 | |
| JP | 2004-361427 A | 12/2004 | |

(Continued)

*Primary Examiner* — Alexander Eisen
*Assistant Examiner* — Cory A Almeida
(74) *Attorney, Agent, or Firm* — Oliff PLC

(57) ABSTRACT

An electro-optical device includes a plurality of scan lines, k signal lines, a pixel that is disposed corresponding to each of intersections between the plurality of scan lines and the k signal lines, an image signal circuit configured to sequentially supply the image signal to each of the k signal lines in a horizontal scanning period, a pre-charge circuit configured to supply, in the horizontal scanning period and in a prescribed order, a pre-charge signal to a signal line of the k signal lines to which the image signal circuit has not supplied the image signal yet; and a control circuit configured to set a first supply period of the k supply periods, during which the image signal is sequentially supplied to each of the k signal lines, to be longer than prescribed supply periods excluding the first supply period of the k supply periods.

15 Claims, 17 Drawing Sheets

(56) References Cited

U.S. PATENT DOCUMENTS

2017/0116906 A1* 4/2017 Tai ........................ G09G 3/2014
2018/0068615 A1* 3/2018 Imai ..................... G09G 3/3225

FOREIGN PATENT DOCUMENTS

| | | |
|---|---|---|
| JP | 2005-257710 A | 9/2005 |
| JP | 3704716 B2 | 10/2005 |
| JP | 2007-279539 A | 10/2007 |
| JP | 2009-216853 A | 9/2009 |
| JP | 2010-049237 A | 3/2010 |
| JP | 2015-106108 A | 6/2015 |
| WO | 99/04384 A1 | 1/1999 |

* cited by examiner

ELECTRO-OPTICAL DEVICE, DRIVING METHOD FOR ELECTRO-OPTICAL DEVICE, AND ELECTRONIC APPARATUS

The present application are based on, and claims priority from JP Application Serial Number 2018-099761, filed May, 24, 2018 and JP Application Serial Number 2019-060071, filed Mar. 27, 2019, the disclosure of which is hereby incorporated by reference herein in its entirety.

BACKGROUND

1. Technical Field

The disclosure relates to an electro-optical device, a driving method for an electro-optical device, and an electronic apparatus.

2. Related Art

An electro-optical device using a liquid crystal element to display an image supplies each pixel through a data line with a video voltage based on an image signal specifying a gray scale of the pixel, thus controlling the transmittance of the pixel through the liquid crystal to a transmittance based on the video voltage. As a result, the gray scale of each pixel is set to the gray scale specified by the image signal. In general, each pixel includes a holding capacitor coupled in parallel to the liquid crystal element. One end of the holding capacitor is coupled to a pixel electrode of the liquid crystal element, and the other end is coupled to a common electrode of the liquid crystal element via a capacitance line.

In a case where the supply of the video voltage to each pixel is insufficient, such as when a sufficient amount of time fails to be provided for the supply of the video voltage to each pixel, the pixel may fail to accurately display the gray scale specified by the image signal. Thus, known electro-optical devices, for example, perform pre-charging to preliminarily charge a data line to a prescribed voltage level, thus preventing insufficient write of the video voltage to each pixel. For example, it is conceivable that, from JP-A-2000-89194, in a liquid crystal display device, a large number of data lines are divided into X blocks each including a prescribed number of data lines, and that an image signal is applied to data lines included in an n-th block, while a pre-charge voltage is simultaneously applied to data lines included in an (n+1)-th block.

However, when the video voltage or the pre-charge voltage is supplied to any of the data lines, a change in voltage level of the data line is propagated to the capacitance line via a coupling capacitance between the data line and the capacitance line. This causes noise in the capacitance line. The known electro-optical devices are disadvantageously subjected to display unevenness due to possible noise in the capacitance line.

SUMMARY

To solve the above-described problem, an aspect of an electro-optical device according to the disclosure includes a plurality of scan lines, k (k is an integer equal to or greater than 3) signal lines, a reference line to which a reference potential is applied, a pixel that is disposed corresponding to each of intersections between the plurality of scan lines and the k signal lines and that includes a holding capacitor coupled to the reference line, the pixel holding, in the holding capacitor, a potential corresponding to an image signal, an image signal circuit configured to sequentially supply, in a horizontal scanning period, the image signal to the k signal lines during k supply periods based on k selection signals sequentially selecting the k signal lines, a pre-charge circuit configured to supply, in the horizontal scanning period and in a prescribed order, a pre-charge signal to a signal line of the k signal lines to which the image signal circuit has not supplied the image signal yet, and a control circuit configured to control the k selection signals in the horizontal scanning period such that at least one of a first supply period and a last supply period of the k supply periods, during which the image signal is sequentially supplied to each of the k signal lines, is longer than a prescribed supply period excluding the first supply period and the last supply period of the k supply periods.

Moreover, an aspect of a driving method for an electro-optical device according to the disclosure is a driving method for an electro-optical device including a plurality of scan lines, k (k is an integer equal to or greater than 3) signal lines, a reference line to which a reference potential is applied, a pixel that is disposed corresponding to each of intersections between the plurality of scan lines and the k signal lines and that includes a holding capacitor coupled to the reference line, the pixel holding, in the holding capacitor, a potential corresponding to an image signal, an image signal circuit configured to sequentially supply the image signal to each of the k signal lines during a horizontal scanning period, and a pre-charge circuit configured to supply, in the horizontal scanning period and in a prescribed order, a pre-charge signal to a signal line of the k signal lines to which the image signal circuit has not supplied the image signal yet, the driving method including setting, in the horizontal scanning period, one of a first supply period and a last supply period of the k supply periods, during which the image signal is sequentially supplied to each of the k signal lines, to be longer than one or more prescribed supply periods excluding the first supply period and the last supply period of the k supply periods.

DESCRIPTION OF EXEMPLARY EMBODIMENTS

First Embodiment

Figure 1:
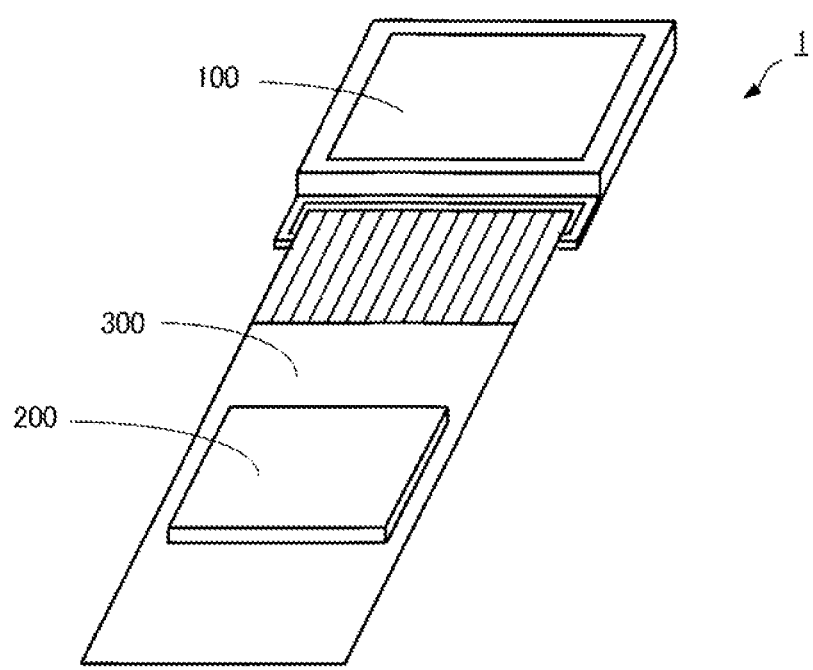
FIG. 1 is an explanatory diagram illustrating an electro-optical device according to a first embodiment of the disclosure.

A first embodiment of the disclosure will be described below with reference to FIG. 1 to FIG. 13. FIG. 1 is an explanatory diagram of an electro-optical device 1 according to the first embodiment of the disclosure. Note that FIG. 1 illustrates a configuration of a signal transmission system for the electro-optical device 1. The electro-optical device 1 includes an electro-optical panel 100, a driving integrated circuit 200 such as a driver Integrated Circuit (IC), and a flexible circuit board 300. The electro-optical panel 100 is coupled to the flexible circuit board 300, on which the driving integrated circuit 200 is mounted. Furthermore, the electro-optical panel 100 is coupled to a host Central Processing Unit (CPU) device (not illustrated) via the flexible circuit board 300 and the driving integrated circuit 200. The driving integrated circuit 200 receives an image signal and various control signals for driving control from the host CPU device via the flexible circuit board 300 to drive the electro-optical panel 100 via the flexible circuit board 300.

The electro-optical device 1 uses a liquid crystal element to display an image. For example, the electro-optical device 1 supplies, via a signal line, each pixel with a video voltage based on an image signal specifying a gray scale of the pixel, to control the transmittance of the pixel through the liquid crystal to a transmittance based on the video voltage. As a result, the gray scale of each pixel is set to the gray scale specified by the image signal. Note that the electro-optical device 1 adopts polarity inversion driving in which a polarity of a voltage applied to the liquid crystal element is inverted every given period, in order to prevent electrical degradation of an electro-optical material. For example, the electro-optical device 1 inverts the level of the image signal supplied to the pixel via the signal line, every other vertical scanning period with respect to a center voltage of the image signal. Note that the period at which the polarity is inverted can be optionally set and may be, for example, a natural number multiple of the vertical scanning period. In this specification, a case where the voltage of the image signal is high with respect to a prescribed voltage such as a center voltage is defined as a positive polarity. A case where the voltage of the image signal is low with respect to the prescribed voltage is defined as a negative polarity.

Figure 2:
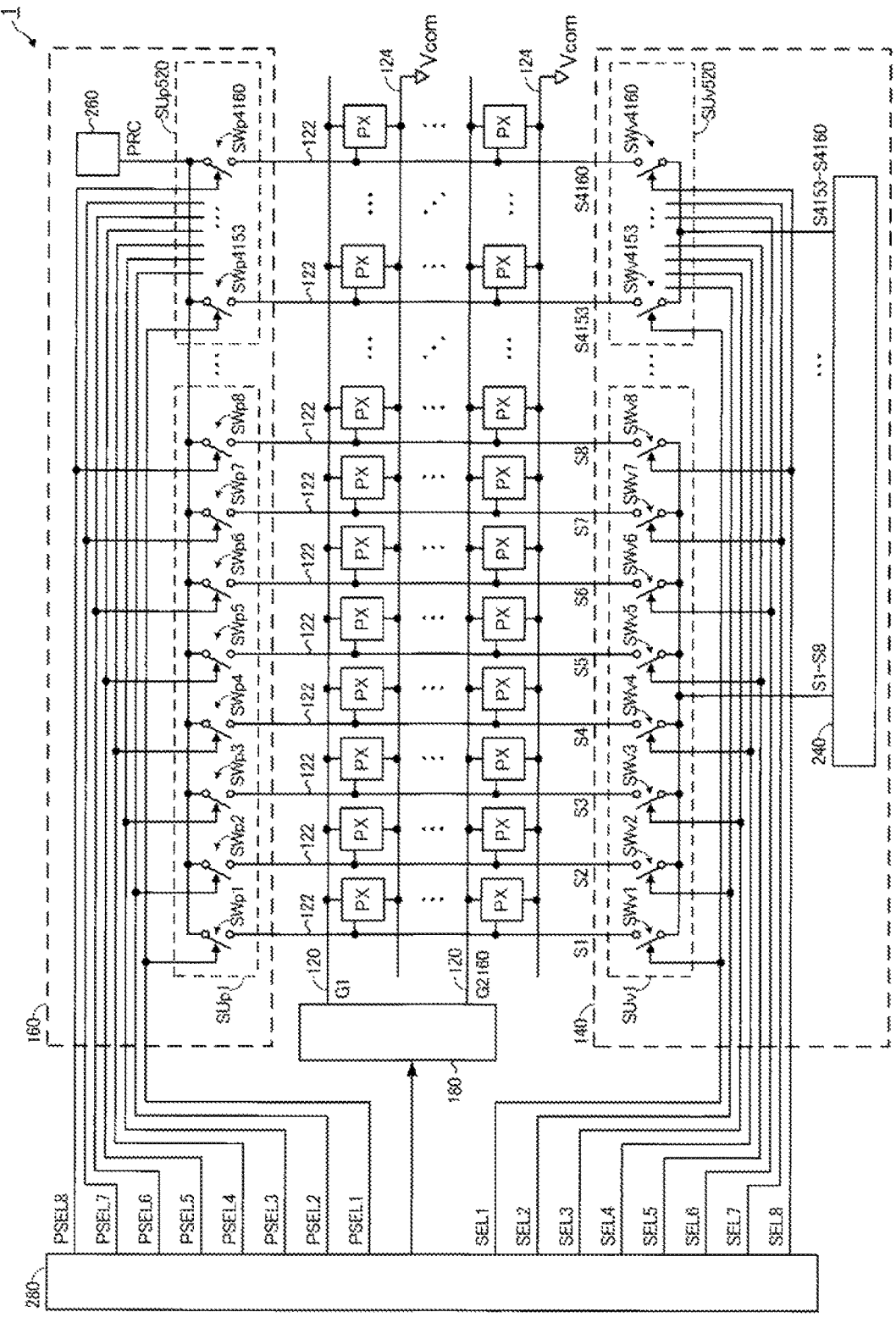
FIG. 2 is a block diagram illustrating a configuration of the electro-optical device according to the first embodiment.

FIG. 2 is a block diagram illustrating a configuration of the electro-optical device 1 according to the first embodiment. The electro-optical device 1 includes a plurality of scan lines 120, a plurality of signal lines 122, capacitance lines 124 to which a reference potential is applied, a plurality of pixels PX, an image signal circuit 140, a pre-charge circuit 160, a scan line driving circuit 180, and a control circuit 280. For example, among the blocks illustrated in FIG. 2, the control circuit 280, and a signal line driving circuit 240 and a pre-charge voltage control circuit 260 that are described below are included in a driving integrated circuit 200. Furthermore, the blocks illustrated in FIG. 2, except the control circuit 280, the signal line driving circuit 240, and the pre-charge voltage control circuit 260, are included in the electro-optical panel 100. The capacitance line 124 is an example of a reference line.

The plurality of signal lines 122 are classified as, for example, a signal line group including k signal lines 122. Note that k is an integer equal to or greater than 3. In the example illustrated in FIG. 2, k is 8, and the total number of the signal lines 122 is 4160. Accordingly, 4160 signal lines 122 are classified as 520 signal line groups each including eight signal lines 122. Note that k is not limited to 8 so long as k is an integer equal to or greater than 3. Furthermore, the total number of the signal lines 122 is not limited to the example illustrated in FIG. 2. For example, the total number of the signal lines 122 may be k. In this case, the number of signal line groups is 1.

Figure 3:
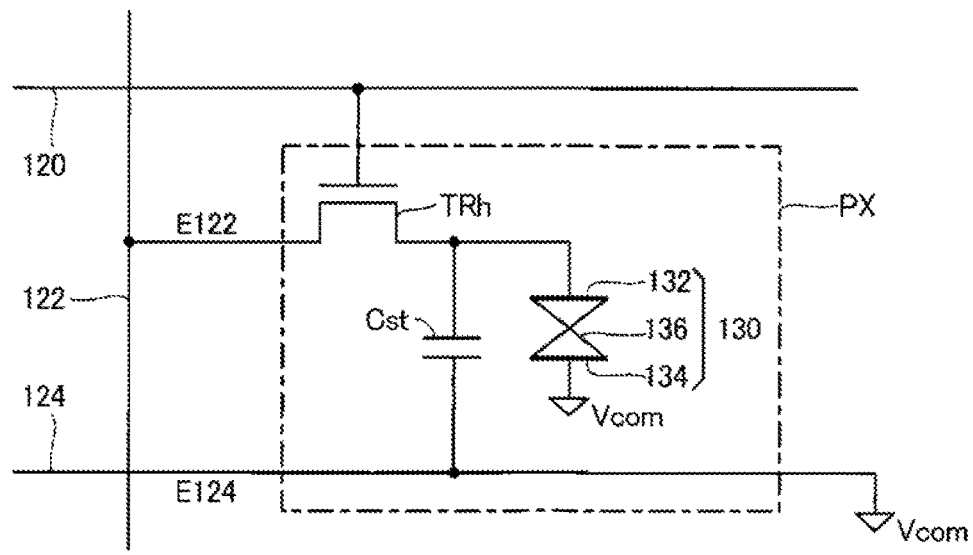
FIG. 3 is a circuit diagram illustrating a configuration of a pixel.

Each of the plurality of pixels PX is disposed corresponding to one of the intersections between the plurality of scan lines 120 and the plurality of signal lines 122. In the example illustrated in FIG. 2, the pixels PX are disposed in a matrix with 2160 rows (in a vertical direction) and 4160 columns (in a horizontal direction). Note that the number of the pixels PX is not limited to the example illustrated in FIG. 2. Furthermore, as illustrated in FIG. 3, each of the pixels PX includes a holding capacitor Cst coupled to the capacitance line 124. In FIG. 2, a row of the pixels PX illustrated at an uppermost position in the drawing is designated as a first row, and a column of the pixels PX illustrated at a leftmost position in the drawing is designated as a first column. Furthermore, the scan line 120 coupled to an m-th row of the pixels PX is also referred to as the scan line 120 for the m-th row. The signal line 122 coupled to an n-th column of the pixels PX is also referred to as the signal line 122 for the n-th column. Note that, in the example illustrated in FIG. 2, m is an integer equal to or greater than 1 and equal to or smaller than 2160 and n is an integer equal to or greater than 1 and equal to or smaller than 4160.

Each of the scan lines 120 is supplied with a scan signal G, and each of the signal lines 122 is supplied with an image signal S or a pre-charge signal PRC. A trailing number of a reference sign of the scan signal G corresponds to a row number. Furthermore, a trailing number of a reference sign of each of the image signal S, a write switch SWv, and a pre-charge switch SWp corresponds to a column number; the write switch SWv and the pre-charge switch SWp will be described below. Each of the capacitance lines 124 is supplied with a common voltage Vcom. A potential of the capacitance line 124 provided by the common voltage Vcom, in other words, the potential based on the common voltage Vcom, is an example of the reference potential.

The image signal circuit 140 sequentially supplies, during a horizontal scanning period, the image signal S to each of eight signal lines 122 included in each signal line group, in other words, each of k signal lines 122. The horizontal scanning period is a period to write, to the pixels PX in one row, the video voltage based on the image signal S supplied to the signal lines 122 in each column. A write target row is selected by the scan signal G supplied from the scan line driving circuit 180 to the corresponding scan line 120.

The image signal circuit 140 includes a plurality of write selecting circuits SUv provided corresponding to the plurality of signal line groups and a signal line driving circuit 240 outputting the image signal S to each of the write selecting circuits SUv. For example, a write selecting circuit SUv1 corresponds to a signal line group including eight signal lines 122 in the first column to the eighth column to select, from the eight signal lines 122 in the first column to the eighth column, the signal line 122 to which the image signal S is to be supplied. Furthermore, a write selecting circuit SUv520 corresponds to a signal line group including eight signal lines 122 from the 4153rd column to the 4160th column to select, from the eight signal lines 122 from the 4153rd column to the 4160th column, the signal line 122 to which the image signal S is to be supplied. The image signal S is supplied to the signal line 122 selected by the write selecting circuit SUv.

Each of the write selecting circuits SUv includes k write switches SWv coupled to the respective eight signal lines 122 included in the corresponding signal line group, in other words, the respective k signal lines 122. Each of the write switches SWv is, for example, an N channel type transistor including a thin film transistor (TFT) or the like and is set to one of a conducting state and a non-conducting state depending on the level of a write selection signal SEL received by a control terminal such as a gate. Note that the write switch SWv may be a P channel type transistor or a switching element other than the TFT. The write selecting circuits SUv have an identical configuration except that coupling destinations of terminals of the write switches SWv other than the control terminals differ among the write selecting circuits SUv. Thus, the description below focuses on a configuration of the write selecting circuit SUv1.

For example, the write selecting circuit SUv1 includes eight write switches SWv1 to SWv8. One end of each of the write switches SWv1 to SWv8 is coupled to a corresponding one of the eight signal lines 122 in the first column to the eighth column. Furthermore, the other ends of the write switches SWv1 to SWv8 are coupled together to sequentially receive image signals S1 to S8 from the signal line driving circuit 240. The write switch SWv to be set to the conducting state is sequentially switchably selected from the write switches SWv1 to SWv8 during one horizontal scanning period under the control of the control circuit 280 described below. As a result, the image signals S1 to S8 sequentially output from the signal line driving circuit 240 are sequentially supplied to the corresponding signal lines 122.

For example, a write selection signal SEL1 is set to a selection potential such as a high-level potential to shift, to the conducting state, the write switch SWv1 receiving the write selection signal SEL1. As a result, the image signal S1 is supplied from the signal line driving circuit 240 to the signal line 122 in the first column to charge the signal line 122 in the first column to the video voltage based on the image signal S1. Note that, for the write selecting circuits SUv other than the write selecting circuit SUv1, the write selection signal SEL1 is also output to the write switch SWv belonging to the same series as that of the write switch SWv1, for example, the write switch SWv4153.

In the example illustrated in FIG. 2, the write switches SW v belong to the same series when a remainder of a division, by 8, of the trailing number of the reference sign of the write switch SWv has the same value, and receive the common write selection signal SEL at the control terminal.

For example, the write switch SWv1 belongs to the same series as that of the write switch SWv4153, and the write switch SWv8 belongs to the same series as that of the write switch SWv4160.

Write switches SWv controlled by a write selection signal SELi are hereinafter also referred to as an i-th series of write switches SWv. Note that i is an integer equal to or greater than 1 and equal to or smaller than 8, in other words, an integer equal to or greater than 1 and equal to or smaller than k. Furthermore, the signal lines 122 coupled to the i-th series of write switches SWv are also referred to as an i-th series of signal lines 122. Accordingly, a trailing number of a reference sign of the write selection signal SEL corresponds to a series number of the signal line 122 to be controlled. Similarly, a trailing number of a reference sign of a pre-charge selection signal PSEL described below corresponds to a series number of the signal line 122 to be controlled.

The signal line driving circuit 240 outputs an image signal S for eight pixels, in other words, an image signal S for k pixels, to each write selecting circuit SUv as a serial signal in time series. For example, the signal line driving circuit 240 outputs, in a prescribed order, the image signals S1 to S8 to the write selecting circuit SUv1, and sequentially outputs image signals S4153 to S4160 to the write selecting circuit SUv520. The image signal S supplied to the same series of signal lines 122 is output in parallel from the signal line driving circuit 240 to each write selecting circuit SUv. In other words, the signal line driving circuit 240 outputs the image signals S to be supplied to the same series of signal lines 122, in parallel to each of the plurality of signal line groups.

The pre-charge circuit 160 sequentially supplies, in the horizontal scanning period, the pre-charge signal PRC to signal lines 122 included in the k signal lines 122 included in each signal line group and to which the image signal circuit 140 has not supplied the image signal S yet. As a result, the signal lines 122 to which the image signal S has not been supplied yet are charged to a prescribed pre-charge voltage based on the pre-charge signal PRC. In other words, the pre-charge circuit 160 performs pre-charging to charge, to the prescribed pre-charge voltage, the signal lines 122 to which the image signal S has not been supplied yet. Note that the prescribed order is the predetermined order of execution of pre-charging and may be the same as or different from the order of arrangement of the signal lines 122.

For example, the pre-charge circuit 160 includes a plurality of pre-charge selecting circuit SUp provided corresponding to the respective signal line groups and a pre-charge voltage control circuit 260 outputting the pre-charge signal PRC to each pre-charge selecting circuits SUp. For example, the pre-charge selecting circuit SUp1 deals with the signal line group with the eight signal lines 122 in the first column to the eighth column, to select, from the eight signal lines 122 in the first column to the eighth column, the signal line 122 to which the pre-charge signal PRC is to be supplied. Furthermore, the pre-charge selecting circuit SUp520 deals with the signal line group with the eight signal lines 122 in the 4153rd column to the 4160th column, to select, from the eight signal lines 122 in the 4153rd column to the 4160th column, the signal line 122 to which the pre-charge signal PRC is to be supplied. The pre-charge signal PRC is supplied to the signal line 122 selected by the pre-charge selecting circuit SUp.

Each of the pre-charge selecting circuits SUp includes k pre-charge switches SWp coupled to the respective eight signal lines 122 included in the corresponding signal line group, in other words, the respective k signal lines 122. Each of the pre-charge switches SWp is an N channel type transistor including a TFT or the like and is set to one of the conducting state and the non-conducting state depending on the level of a pre-charge selection signal PSEL received by a control terminal such as a gate. Note that the pre-charge switch SWp may be a P channel type transistor or a switching element other than the TFT. The pre-charge selecting circuits SUp have an identical configuration except that the signal lines 122 coupled to which the pre-charge switches SWp differ among the pre-charge selecting circuits SUp. Thus, in the description below, a configuration of the pre-charge selecting circuit SUp1 will be focused on.

For example, the pre-charge selecting circuit SUp1 includes eight pre-charge switches SWp1 to SWp8. One end of each of the pre-charge switches SWp1 to SWp8 is coupled to a corresponding one of the eight signal lines 122 in the first column to the eighth column. Furthermore, the other ends of the pre-charge switches SWp1 to SWp8 are coupled together to receive the pre-charge signal PRC from the pre-charge voltage control circuit 260. The pre-charge switch SWp to be set to the conducting state is selected from the pre-charge switches SWp1 to SWp8 under the control of the control circuit 280 described below. As a result, the pre-charge signal PRC output from the pre-charge voltage control circuit 260 is supplied to the signal line 122 coupled to the pre-charge switch SWp in the conducting state.

For example, a pre-charge selection signal PSEL1 is set to a selection potential such as a high-level to shift, to the conducting state, a first series of pre-charge switches SWp such as the pre-charge switch SWp1 which receives the pre-charge selection signal PSEL1. As a result, the pre-charge signal PRC is supplied from the pre-charge voltage control circuit 260 to a first series of signal lines 122, and the first series of signal lines 122 is charged to the prescribed pre-charge voltage based on the pre-charge signal PRC. A period during which the pre-charge selection signal PSEL is maintained at the selection potential is an example of a pre-charge period during which the pre-charge signal PRC is supplied to the signal line 122.

Note that the other end of each of the pre-charge switches SWp-1 to SWp-8 is also coupled to the other ends of the pre-charge switches SWp in the pre-charge selecting circuits SUp other than the pre-charge selecting circuit SUp1. In other words, the other ends of the pre-charge switches SWp1 to SWp4160 are coupled together to receive the pre-charge signal PRC from the pre-charge voltage control circuit 260.

Based on a set value stored in an external set value storage means or the like (not illustrated), the pre-charge voltage control circuit 260 outputs, to the plurality of pre-charge switches SWp, the pre-charge signal PRC for supplying the signal line 122 with the pre-charge voltage based on the polarity of the image signal S.

The scan line driving circuit 180 sequentially outputs, to the plurality of pixels PX on a row-by-row basis, the scan signal G selecting a row to which the image signal S is to be supplied. For example, during a first horizontal scanning period during which the video voltage is written to the pixels PX in the first row, the scan line driving circuit 180 shifts the potential of a scan signal G1 to the selection potential such as a high-level.

The control circuit 280 receives, from an external host CPU device (not illustrated), external signals such as a vertical synchronizing signal defining the vertical scanning period and a horizontal synchronizing signal defining the horizontal scanning period. The control circuit 280 synchronously controls the scan line driving circuit 180, the image signal circuit 140, and the pre-charge circuit 160, based on signals received from the host CPU device.

For example, the control circuit 280 uses the write selection signal SEL and the like to control timings to supply the image signal S to the eight signal lines 122 included in each signal line group, in other words, the k signal lines 122. The control circuit 280 outputs, to each series of write switches SWv, write selection signals SEL1 to SEL8 selecting the series of signal lines 122 to which the image signal S is to be supplied. For example, in a case of supplying the image signal S to the first series of signal lines 122, the control circuit 280 shifts the potential of the write selection signal SEL1 to the selection potential. As a result, the first series of write switches SWv shifts to the conducting state to cause the first series of signal lines 122 to be supplied with the image signal S output from the signal line driving circuit 240.

Note that the control circuit 280 adjusts the period during which the write selection signal SEL is maintained at the selection potential to adjust the length of a supply period during which the image signal S is supplied to each series of signal lines 122. In other words, the control circuit 280 controls, in the horizontal scanning period, the lengths of k supply periods during which the image signal S is sequentially supplied to the eight signal lines 122 included in each signal line group, in other words, the k signal lines 122. For example, the control circuit 280 sets one of first and last supply periods of the k supply periods to be longer than each of one or more prescribed supply periods in the k supply periods except the first supply period and the last supply period.

The control circuit 280 outputs, to each series of the pre-charge switches SWp, pre-charge selection signals PSEL1 to PSEL8 selecting a series of signal lines 122 to which the pre-charge signal PRC is to be supplied. For example, in a case of supplying the pre-charge signal PRC to a second series of signal lines 122, the control circuit 280 shifts the potential of the pre-charge selection signal PSEL2 to the selection potential. As a result, a second series of write switches SWv shifts to the conducting state to cause the second series of signal lines 122 to be supplied with the pre-charge signal PRC output from the pre-charge voltage control circuit 260. Operation timings for the write selection signal SEL, the pre-charge selection signal PSEL, and the like will be described using FIG. 5 to FIG. 12.

FIG. 3 is a circuit diagram illustrating a configuration of the pixel PX. Each of the pixels PX includes a liquid crystal element 130, the holding capacitor Cst coupled to the capacitance line 124, and a pixel transistor TRh. The liquid crystal element 130 is an electro-optical element including a pixel electrode 132 and a common electrode 134 opposite to each other, and a liquid crystal 136 disposed between the pixel electrode 132 and the common electrode 134. A transmittance of the liquid crystal 136 changes according to a voltage applied between the pixel electrode 132 and the common electrode 134, thus changing a display gray scale. Note that the common electrode 134 is supplied, via a common line (not illustrated), with a common voltage Vcom that is a constant voltage.

The holding capacitor Cst is provided in parallel with the liquid crystal element 130. One end of the holding capacitor Cst is coupled to the pixel transistor TRh. The other end of the holding capacitor Cst is coupled to the common electrode 134 via the capacitance line 124.

The pixel transistor TRh is, for example, an N channel type transistor including a TFT and is provided between the liquid crystal element 130 and the signal line 122. The pixel transistor TRh is set to one of the conducting state and the non-conducting state depending on the level of the scan signal G supplied to the scan line 120 coupled to a gate of the pixel transistor TRh. In other words, the pixel transistor TRh controls an electric coupling between the liquid crystal element 130 and the signal line 122. For example, a scan signal Gm is set to the selection potential to simultaneously or substantially simultaneously shift the pixel transistors TRh in the pixels PX in the m-th row to the conducting state.

When the pixel transistor TRh is controlled to be set to the conducting state, the video voltage based on the image signal S supplied from the signal line 122 is applied to the liquid crystal element 130. Application of the video voltage based on the image signal S sets the liquid crystal 136 to the transmittance based on the image signal S. Furthermore, when a light source (not illustrated) is in a lit state, light emitted from the light source passes through the liquid crystal 136 in the liquid crystal element 130 of the pixel PX and is then output to the outside of the electro-optical device 1. In other words, in a case where the video voltage based on the image signal S is applied to the liquid crystal element 130 and the light source is set to the lit state, the pixel PX displays the gray scale based on the image signal S.

Furthermore, the holding capacitor Cst provided in parallel with the liquid crystal element 130 is charged to the video voltage applied to the liquid crystal element 130. In other words, each pixel PX holds, in the holding capacitor Cst, the potential corresponding to the image signal S.

Note that, when the pixel transistor TRh is controlled to be set to the conducting state, the holding capacitor Cst and the signal line 122 are electrically coupled to each other. Thus, a fluctuation in a potential E122 of the signal line 122 may propagate to the capacitance line 124 via the holding capacitor Cst. Furthermore, a coupling capacitance (not illustrated) between the signal line 122 and the capacitance line 124 causes a fluctuation in the potential E122 of the signal line 122 to propagate to the capacitance line 124. FIG. 2 illustrates an example of arrangement of the capacitance lines in the row direction. However, the propagation of the fluctuation is particularly significant in a case where the capacitance lines 124 are disposed in the column direction, in other words, disposed to overlap the signal lines 122. In this case, a period occurs during which the potential E124 of the capacitance line 124 is unstable. Now, a potential fluctuation in the capacitance line 124 caused by a potential fluctuation in the signal line 122 will be described using FIG. 4.

Figure 4:
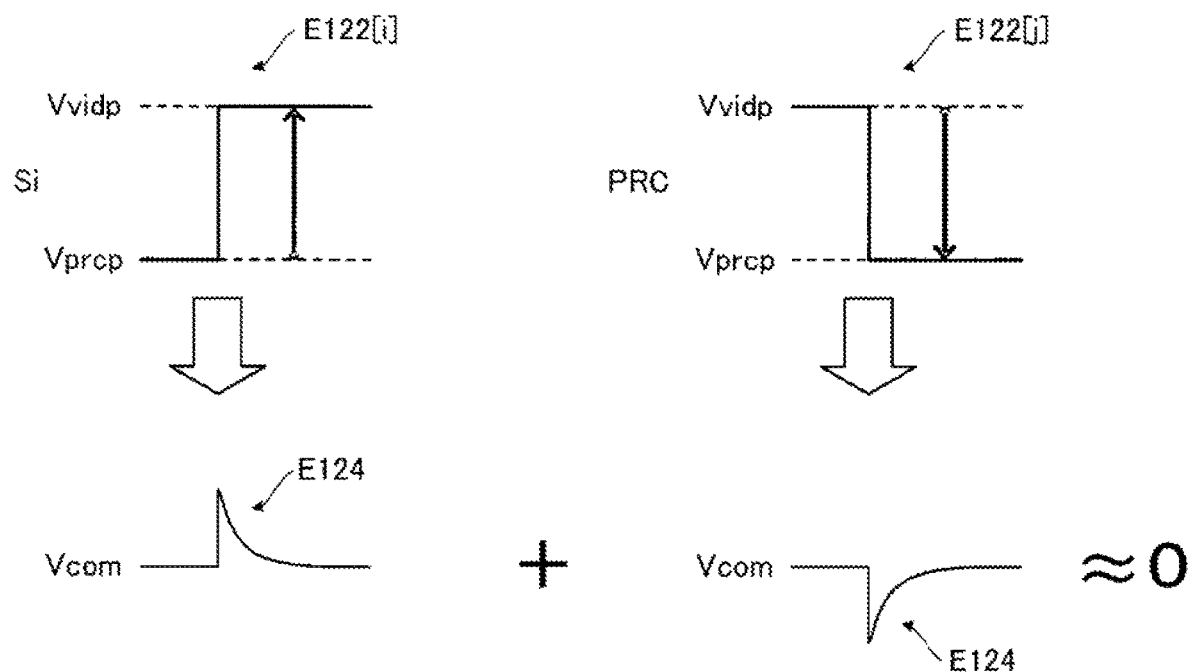
FIG. 4 is a diagram illustrating a relationship between a change in potential of a signal line and a change in potential of a capacitance line.

FIG. 4 is a diagram illustrating a relationship between a change in the potential E122 of the signal line 122 and a change in a potential E124 of the capacitance line 124. Note that FIG. 4 illustrates the relationship between the change in the potential E122 of the signal line 122 and the change in the potential E124 of the capacitance line 124 in a case where raster display is performed by positive polarity driving. A potential E122[i] represents the potential E122 of an i-th series of signal lines 122. A potential E122[j] represents the potential E122 of a j-th series of signal lines 122. In the example illustrated in FIG. 4, an image signal Si is supplied to the i-th series of signal lines 122, and the pre-charge signal PRC is supplied to the j-th series of signal lines 122. A video voltage Vvidp represents a voltage based on the image signal Si obtained during the positive polarity driving. A pre-charge voltage Vprcp represents a voltage based on the pre-charge signal PRC obtained during the positive polarity driving. For example, the video voltage Vvidp is 12V, and the pre-charge voltage Vprcp is 4V.

The potential E122[i] of the i-th series of signal lines 122 to which the video voltage Vvidp is to be applied shifts from the pre-charge voltage Vprcp to the video voltage Vvidp when the image signal Si for applying the video voltage Vvidp is supplied to the i-th series of signal lines 122. In this case, the potential E124 of the capacitance line 124 increases from the common voltage Vcom and returns to the common voltage Vcom again.

Furthermore, the potential E122[j] of the j-th series of signal lines 122 to be pre-charged shifts from the video voltage Vvidp to the pre-charge voltage Vprcp when the pre-charge signal PRC for applying the pre-charge voltage Vprcp is supplied to the j-th series of signal lines 122. In this case, the potential E124 of the capacitance line 124 decreases from the common voltage Vcom and returns to the common voltage Vcom again.

When the pre-charge signal PRC is supplied, the potential E124 of the capacitance line 124 changes by an amount identical or equivalent to the amount of a change of the potential E124 of the capacitance line 124 during the supply of the image signal Si in an opposite direction. Accordingly, the pre-charge period corresponding to the supply period of the pre-charge signal PRC is caused to overlap the supply period of the image signal S to offset a potential fluctuation in the capacitance line 124, in other words, to offset noise overlapping the capacitance line 124. Thus, an effect of offsetting noise overlapping the capacitance line 124 is produced by subjecting the capacitance line 124 to potential fluctuations having an identical amount or equivalent amounts and occurring in opposite directions, and this effect is hereinafter also referred to as the counter noise effect. In a case where the counter noise effect is produced, the potential fluctuation in the capacitance line 124 is suppressed to stabilize the potential E124 of the capacitance line 124 early compared to a case where no counter noise effect is produced.

Note that, for the relationship between the potential fluctuation in the capacitance line 124 during the supply of the image signal Si and the potential fluctuation in the capacitance line 124 during the supply of the pre-charge signal PRC, the relationship observed in natural images and the like differs from the relationship in the example illustrated in FIG. 4 and that the natural images and the like do not necessarily allow the counter noise effect to be produced. However, the natural images and the like involve significant random elements compared to solid images for which all the pixels PX have an identical pixel value. Thus, even in a case where the counter noise effect fails to be produced, the natural images and the like cause a less visually uncomfortable feeling than solid images for which no counter noise effect is produced.

FIG. 5 to FIG. 12 illustrate operation timings during each horizontal scanning period H of the electro-optical device 1 in a case where raster display is performed by positive polarity driving. A number in a bracket of a reference sign of the potential E122 represents the series of the signal lines 122. For example, a potential E122[1] represents the potential E122 of the first series of signal lines 122. A potential E122[8] represents the potential E122 of the eighth series of signal lines 122. In the example illustrated in FIG. 5 to FIG. 12, the image signal circuit 140 supplies the image signal S to one of the k signal lines 122 during each of the k supply periods included in the horizontal scanning period H. Furthermore, the pre-charge circuit 160 supplies the pre-charge signal PRC to one of the k signal lines 122 during each of the pre-charge periods corresponding to the first to the (k−1)-th supply periods of the k supply periods included in the horizontal scanning period H. The control circuit 280 sets, among the k supply periods included in the horizontal scanning period H, the first and the k-th supply periods to be longer than the other supply periods of the k supply periods except the first supply period and the k-th supply period.

Figure 5:
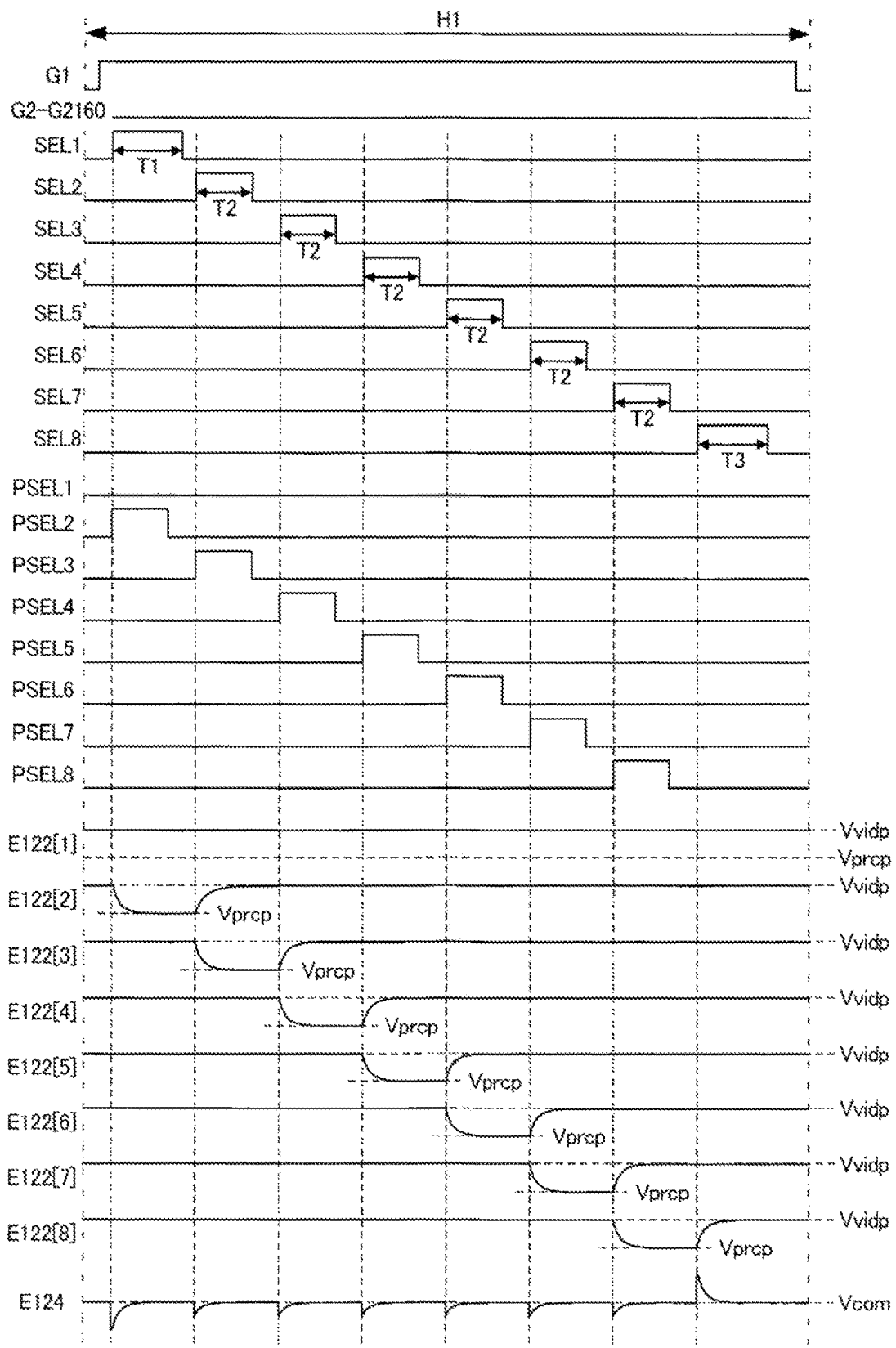
FIG. 5 is a diagram illustrating operation timings during a first horizontal scanning period.

FIG. 5 is a diagram illustrating operation timings during a first horizontal scanning period H1. The first horizontal scanning period H1 is a horizontal scanning period H during which the video voltage Vvidp is written to the pixels PX in the first row. During the first horizontal scanning period H1, the potential of the scan signal G1 supplied to the scan lines 120 in the first row is set to a high level. Scan signals G2 to G2160 supplied to the scan lines 120 other than the scan lines 120 in the first row are maintained at a low level.

A period during which each of the write selection signals SEL1 to SEL8 is at the high level is switched in the order of the write selection signals SEL1 to SEL8. In other words, the supply period is sequentially assigned to each of the first series of signal lines 122 to the eighth series of signal lines 122. As a result, the image signal S is sequentially supplied to each series of signal lines 122.

A high-level period of each of the pre-charge selection signals PSEL2 to PSEL8 is switched in keeping with switching of the high-level period of each of the write selection signals SEL1 to SEL7. For example, the pre-charge selection signal PSEL2 shifts to the high level in synchronism with a timing when the write selection signal SEL1 shifts to the high level. After a prescribed time elapses, the pre-charge selection signal PSEL2 shifts to the low level. Note that the pre-charge selection signal PSEL1 is maintained at the low level.

During the supply period for the first series, in other words, during the period when the write selection signal SEL1 is at the high level, the first series of signal lines 122 is not pre-charged. Thus, the same video voltage Vvidp is applied again to the first series of signal lines 122 charged to the video voltage Vvidp for display during the preceding horizontal scanning period H. Consequently, the potential E122[1] of the first series of signal lines 122 does not substantially fluctuate. This substantially prevents a potential fluctuation in the capacitance line 124 caused by capacitance coupling between the capacitance line 124 and the first series of signal line 122. To create a state in which the potential E122 of the signal lines 122 is substantially prevented from fluctuating during the first horizontal scanning period H of each frame, a dummy pixel row that is invisible in the display is provided and the same image signal S as that for raster display or a gray-level signal is written to the signal lines 122. Alternatively, preferably, before the first horizontal scanning period H of each frame starts, for example, an operation of writing the same image signal S as that for raster display or a gray-level signal to the signal lines 122 is performed.

Furthermore, during the supply period for the first series, the second series of signal lines 122 is pre-charged during the pre-charge period for the second series when the pre-charge selection signal PSEL2 is maintained at the high level. In other words, the pre-charge signal PRC is supplied to the second series of signal lines 122 during the pre-charge period for the second series. Thus, a potential E122[2] of the second series of signal lines 122 shifts from the video voltage Vvidp to the pre-charge voltage Vprcp as described using FIG. 4. The capacitance coupling between the capacitance line 124 and the second series of signal lines 122 causes a fluctuation in the potential E122 [2] to propagate to the capacitance line 124, and a potential fluctuation occurs in the capacitance line 124. As illustrated in FIG. 4, the potential E124 of the capacitance line 124 decreases from the common voltage Vcom and returns to the common voltage Vcom again.

During the supply period for the second series, in other words, during the period when the write selection signal SEL2 is at the high level, the second series of signal lines 122 is charged to the pre-charge voltage Vprcp, and the video voltage Vvidp is applied to the second series of signal lines 122. Thus, the potential E122 [2] of the second series of signal lines 122 shifts from the pre-charge voltage Vprcp to the video voltage Vvidp as described using FIG. 4. The capacitance coupling between the capacitance line 124 and the second series of signal lines 122 causes a fluctuation in the potential E122[2] to propagate to the capacitance line 124, and a potential fluctuation occurs in the capacitance line 124.

However, during the supply period for the second series, a third series of signal lines 122 is pre-charged during the pre-charge period for the third series overlapping the supply period for the second series. Thus, the counter noise effect described using FIG. 4 suppresses a fluctuation in the potential E124 of the capacitance line 124 compared to the fluctuation during the supply period for the first series.

For example, during the supply period for the second series, the third series of signal lines 122 is pre-charged during the period when the pre-charge selection signal PSEL3 is at the high level. Thus, a potential E122[3] of the third series of signal lines 122 shifts from the video voltage Vvidp to the pre-charge voltage Vprcp. The capacitance coupling between the capacitance line 124 and the third series of signal lines 122 causes a fluctuation in the potential E122[3] to propagate to the capacitance line 124, and a potential fluctuation occurs in the capacitance line 124. A potential fluctuation in the capacitance line 124 due to a fluctuation in the potential E122[2] is caused to overlap a potential fluctuation in the capacitance line 124 due to a fluctuation in the potential E122 [3] in an opposite direction of the fluctuation in the potential E122[2], to cancel possible noise in the capacitance line 124 as illustrated in FIG. 4.

Compared to a fluctuation in the potential E124 of the capacitance line 124 during the supply period for the first series, a fluctuation in the potential E124 of the capacitance line 124 during the supply period for the second series is suppressed, thus stabilizing the potential E124 of the capacitance line 124 early. This allows a length T2 of the supply period for the second series to be made smaller than a length T1 of the supply period for the first series. Note that, in a case where the supply period ends before the potential E124 of the capacitance line 124 is stabilized, in other words, before the potential E124 of the capacitance line 124 returns to the common voltage Vcom, the potential E124 of the capacitance line 124 returns to the common voltage Vcom after the supply period ends. In this case, a potential of the pixel electrode 132 coupled to the holding capacitor Cst also fluctuates after the supply period ends. In other words, after the supply period ends, the potential of the pixel electrode 132 changes from the video voltage Vvidp based on the image signal S. In this case, the pixel PX fails to accurately display the gray scale specified by the image signal S.

Accordingly, for the supply period for the first series, the length T1 of the supply period is set longer than the length T2 of the supply period for the second series to prevent the end of the supply period before the potential E124 of the capacitance line 124 is stabilized. As a result, the gray scale specified by the image signal S can also be accurately displayed by a first series of pixels PX to which the image signal S is supplied during the supply period for the first series.

Like during the supply period for the second series, during the supply period for the third series to the supply period for a seventh series, the counter noise effect suppresses the fluctuation in the potential E124 of the capacitance line 124 compared to the fluctuation during the supply period for the first series. As described above, each of the supply periods for the second series to the seventh series is a supply period during which the image signal S is supplied to a signal line 122 to which the pre-charge signal PRC has already been supplied. Each of the supply periods for the second series to the seventh series includes a period overlapping the pre-charge period during which the pre-charge signal PRC is supplied to another signal line 122.

During the supply period for an eighth series, in other words, during the period when the write selection signal SEL8 is at the high level, the video voltage Vvidp is applied to an eighth series of signal lines 122 charged to the pre-charge voltage Vprcp. Thus, the potential E122[8] of the eighth series of signal lines 122 shifts from the pre-charge voltage Vprcp to the video voltage Vvidp. The capacitance coupling between the capacitance line 124 and the eighth series of signal lines 122 causes a fluctuation in the potential E122[8] to propagate to the capacitance line 124, and a potential fluctuation occurs in the capacitance line 124. For example, the potential E124 of the capacitance line 124 increases from the common voltage Vcom and returns to the common voltage Vcom again.

Note that, during the supply period for the eighth series, no other series of signal lines 122 is pre-charged. Thus, during the supply period for the eighth series, the counter noise effect fails to be produced. As a result, compared to the supply periods for the second series to the seventh series in which the counter noise effect is produced, the supply period for the eighth series needs a longer time until the potential E124 of the capacitance line 124 is stabilized. Accordingly, for the supply period for the eighth series, a length T3 of the supply period is set longer than the length T2 of the supply period for the second series to prevent the end of the supply period before the potential E124 of the capacitance line 124 is stabilized. As a result, the gray scale specified by the image signal S can also be accurately displayed by an eighth series of pixels PX to which the image signal S is supplied during the supply period for the eighth series.

In other words, the control circuit 280 sets each of the length T1 of the supply period for the first series and the length T3 of the supply period for the eighth period to be shorter than the length T2 of each of the second series to the seventh series. Note that, in the example illustrated in FIG. 5, the supply period for the first series is the first supply period of the eight supply periods during which the image signal S is sequentially supplied to each of the eight series of signal lines 122 and that the supply period for the eighth series is the last supply period of the eight supply periods. The supply periods for the second series to the seventh series correspond to supply periods among the eight supply periods except the first and last supply periods.

In other words, in the example illustrated in FIG. 5, the supply period for the first series is an example of the first supply period. The supply periods for the second series to the seventh series are an example of the prescribed supply period. The supply period for the eighth series is an example of the last supply period. Accordingly, the control circuit 280 sets each of the lengths T1 and T3 of both the first and last supply periods of the eight supply periods to be larger than the length T2 of the prescribed supply period corresponding to the supply periods among the eight supply periods except the first and last supply periods. Note that the control circuit 280 may set the length of one of the first and last supply periods of the eight supply periods to be larger than the length T2 of the prescribed supply period.

Figure 6:
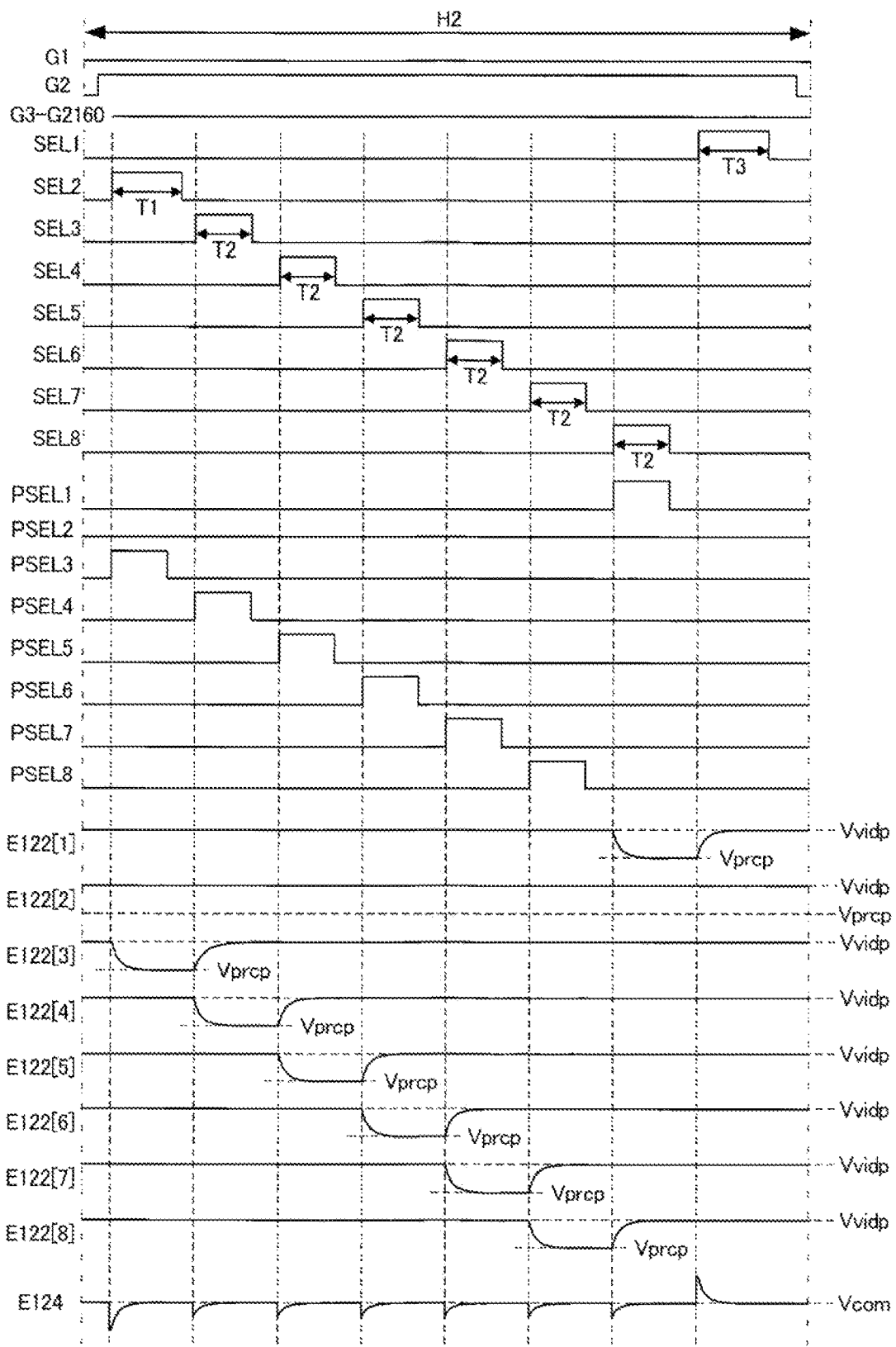
FIG. 6 is a diagram illustrating operation timings during a second horizontal scanning period.

FIG. 6 is a diagram illustrating operation timings of a second horizontal scanning period H2. Detailed description concerning operation similar to the operation illustrated in FIG. 5 will be omitted. The second horizontal scanning period H2 is a horizontal scanning period H for writing the video voltage Vvidp to the pixels PX in the second row. In the second horizontal scanning period H2, a potential of the scan signal G2 to be supplied to the scan line 120 in the second row is set to a high level. The scan signals G1 and G3 to G2160 to be supplied to the scan lines 120 in rows other than the second row are maintained at a low level.

The second horizontal scanning period H2 is different from the first horizontal scanning period H1 in the order when the image signal S is supplied in order to the signal line 122 of each series from the first series to the eighth series. For example, each high level period of the write selection signals SEL1 to SEL8 is switched in order of the write selection signals SEL2 to SEL8 and SEL1. Specifically, the control circuit 280 makes the signal line 122 to be supplied with the image signal S in the first supply period different between two horizontal scanning periods H, namely, the first horizontal scanning period H1 and the second horizontal scanning period H2. Furthermore, the control circuit 280 makes the signal line 122 to be supplied with the image signal S in the last supply period different between two horizontal scanning periods H, namely, the first horizontal scanning period H1 and the second horizontal scanning period H2.

Each high level period of the pre-charge selection signals PSEL3 to PSEL8 and PSEL1 is switched in order in accordance with the switching of each high level period of the write selection signals SEL2 to SEL8. For example, the pre-charge selection signal PSEL3 changes to a high level in synchronization with the timing when the write selection signal SEL2 changes to a high level, and then changes to a low level after a prescribed time period elapses. Furthermore, for example, the pre-charge selection signal PSEL1 changes to a high level in synchronization with the timing when the write selection signal SEL8 changes to a high level, and then changes to a low level after a prescribed time period elapses. Note that the pre-charge selection signal PSEL2 is maintained at a low level.

Therefore, in the second horizontal scanning period H2, the counter noise effect fails to be achieved in the supply period of the second series that is the first supply period and the supply period of the first series that is the last supply period. In contrast, the counter noise effect can be achieved in the supply periods from the third series to the eighth series. For this reason, the control circuit 280 lengthens a length T1 of the supply period of the second series and a length T3 of the supply period of the first series to be longer than a length T2 of each of the supply periods from the third series to the eighth series. As a result, each pixel PX of each series can accurately display the gray scale specified by the image signal S. Note that the supply periods from the third series to the eighth series illustrated in FIG. 6 represent one example of prescribed supply periods.

Furthermore, the electro-optical device 1 makes the signal line 122 to be supplied with the image signal S in the first supply period different between two horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the electro-optical device 1 makes the signal line 122 to be supplied with the image signal S in the last supply period different between two horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

According to the operation timings illustrated in FIG. 5 and FIG. 6, the control circuit 280 assigns the supply period of the second series in which the image signal S is supplied to the signal line 122 of the second series to the first supply period in the second horizontal scanning period H2, and the control circuit 280 assigns the supply period of the second series to a prescribed supply period in the first horizontal scanning period H1. Further, the control circuit 280 lengthens the length T1 of the first supply period to be longer than the length T2 of the prescribed supply period. Furthermore, the pre-charge circuit 160 does not supply the pre-charge signal PRC to the signal line 122 of the second series in the second horizontal scanning period H2, and the pre-charge circuit 160 supplies the pre-charge signal PRC to the signal line 122 of the second series in the first horizontal scanning period H1. Note that, in the examples illustrated in FIG. 5 and FIG. 6, the signal line 122 of the second series represents one example of a first signal line 122 of k signal lines 122, the second horizontal scanning period H2 represents one example of the first horizontal scanning period H that is one of two horizontal scanning periods H, and the first horizontal scanning period H1 represents one example of the second horizontal scanning period H that is the other of the two horizontal scanning periods H.

Figure 7:
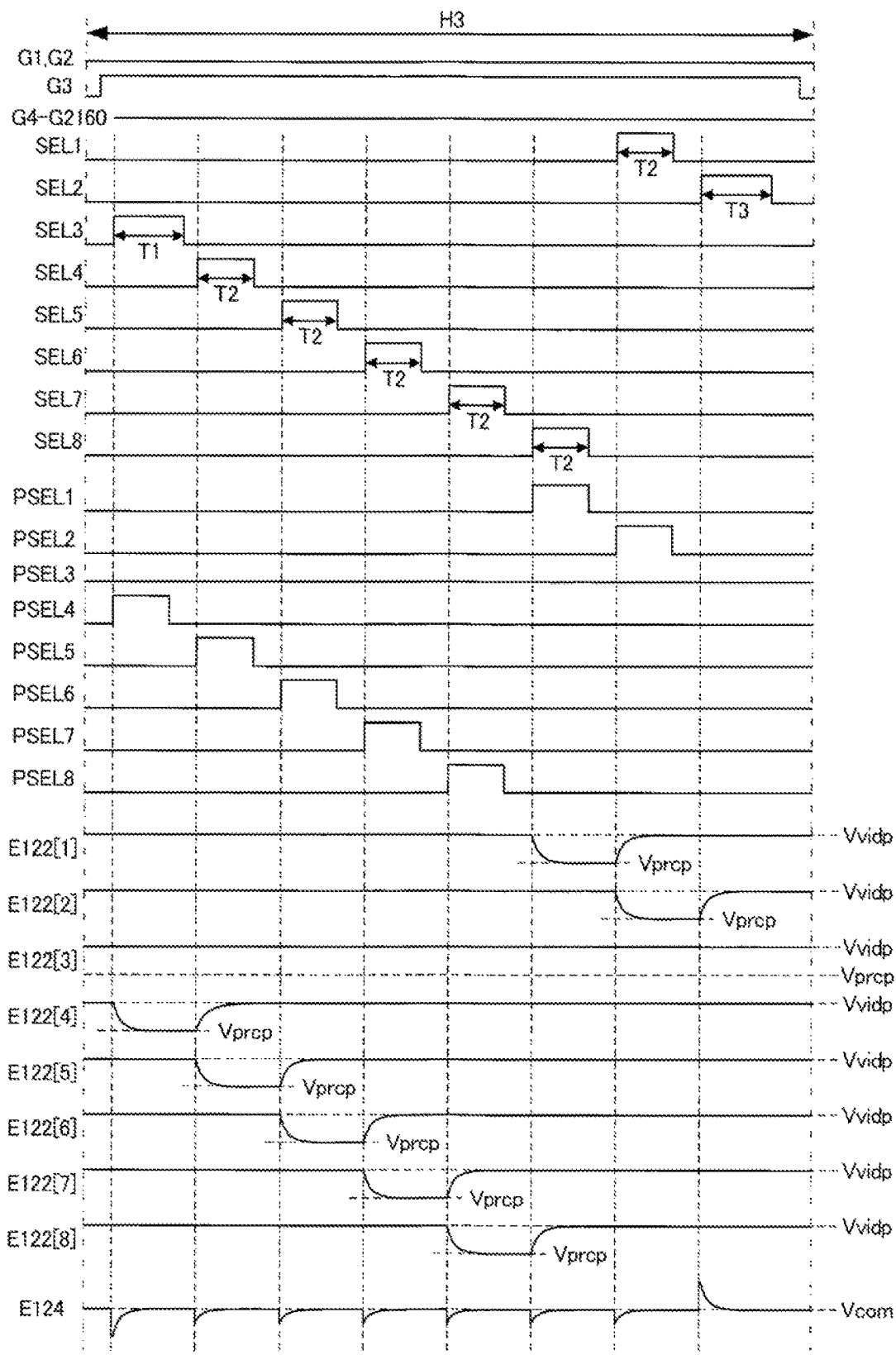
FIG. 7 is a diagram illustrating operation timings during a third horizontal scanning period.

FIG. 7 is a diagram illustrating operation timings of a third horizontal scanning period H3. Detailed description concerning operation similar to the operation illustrated in FIG. 5 will be omitted. The third horizontal scanning period H3 is a horizontal scanning period H for writing the video voltage Vvidp to the pixels PX in the third row. In the third horizontal scanning period H3, a potential of the scan signal G3 to be supplied to the scan line 120 in the third row is set to a high level. The scan signals G1, G2, and G4 to G2160 to be supplied to the scan lines 120 in rows other than the third row are maintained at a low level.

The third horizontal scanning period H3 is different from the first horizontal scanning period H1 and the second horizontal scanning period H2 in the order when the image signal S is supplied in order to the signal line 122 of each series from the first series to the eighth series. For example, each high level period of the write selection signals SEL1 to SEL8 is switched in order of the write selection signals SEL3 to SEL8, SEL1, and SEL2. Specifically, the control circuit 280 makes the signal line 122 to be supplied with the image signal S in the first supply period different in three horizontal scanning periods H. Furthermore, the control circuit 280 makes the signal line 122 to be supplied with the image signal S in the last supply period different in three horizontal scanning periods H.

Each high level period of the pre-charge selection signals PSEL4 to PSEL8, PSEL1, and PSEL2 is switched in order in accordance with the switching of each high level period of the write selection signals SEL3 to SEL8 and SEL1. For example, the pre-charge selection signal PSEL4 changes to a high level in synchronization with the timing when the write selection signal SEL3 changes to a high level, and then changes to a low level after a predetermined time period elapses. Furthermore, for example, the pre-charge selection signal PSEL2 changes to a high level in synchronization with the timing when the write selection signal SEL1 changes to a high level, and then changes to a low level after a prescribed time period elapses. Note that the pre-charge selection signal PSEL3 is maintained at a low level.

Therefore, in the third horizontal scanning period H3, the counter noise effect fails to be achieved in the supply period of the third series that is the first supply period and the supply period of the second series that is the last supply period. In contrast, the counter noise effect can be achieved in the supply periods from the fourth series to the eighth series and the supply period of the first series. For this reason, the control circuit 280 lengthens a length T1 of the supply period of the third series and a length T3 of the supply period of the second series to be longer than a length T2 of each supply period of the supply periods from the fourth series to the eighth series and the supply period of the first series. As a result, each pixel PX of each series can accurately display the gray scale specified by the image signal S. Note that the supply periods from the fourth series to the eighth series and the supply period of the first series illustrated in FIG. 7 represent one example of prescribed supply periods.

Furthermore, the electro-optical device 1 makes the signal line 122 to be supplied with the image signal S in the first supply period different in three horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the electro-optical device 1 makes the signal line 122 to be supplied with the image signal S in the last supply period different in three horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Figure 8:
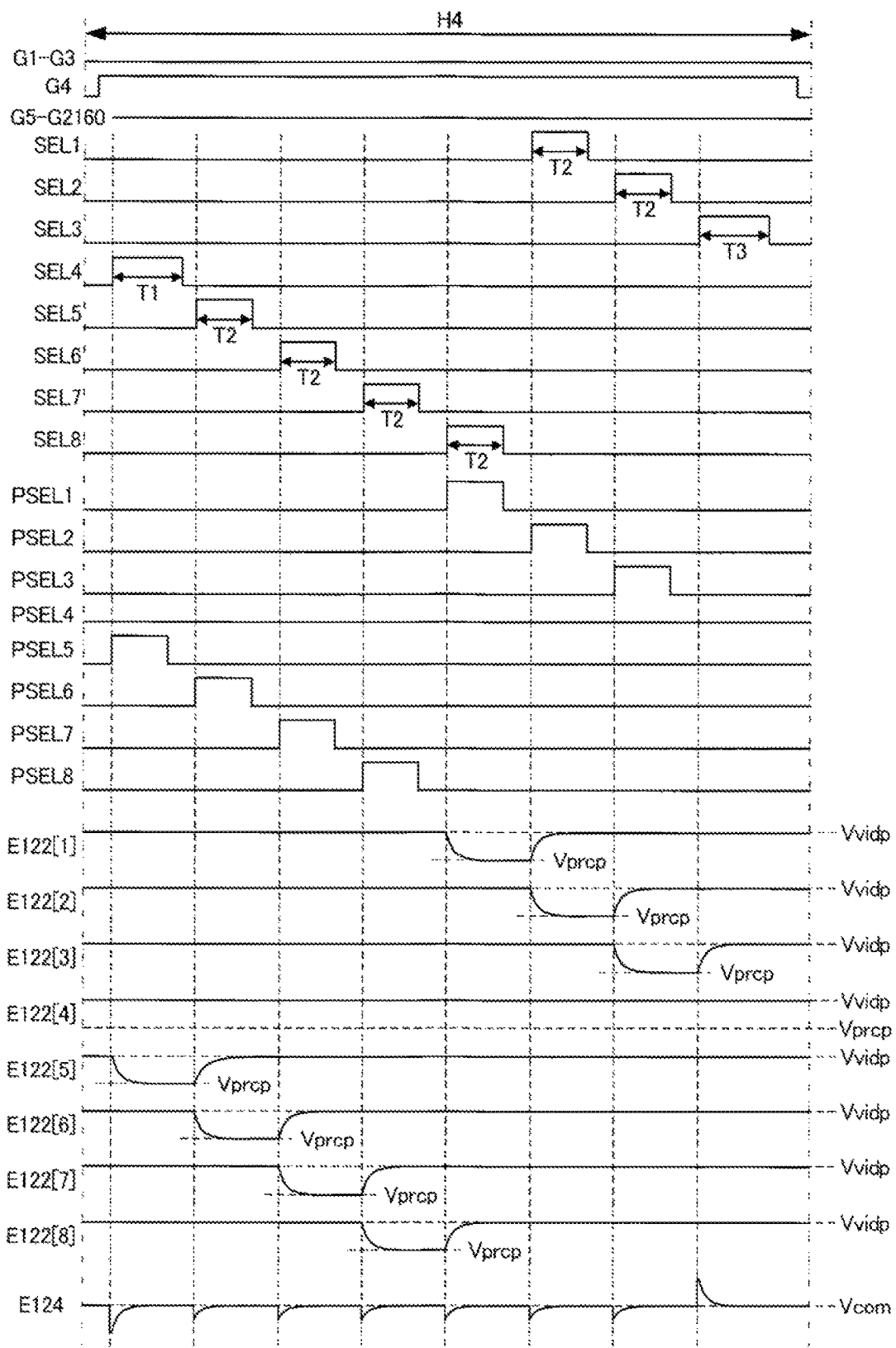
FIG. 8 is a diagram illustrating operation timings during a fourth horizontal scanning period.

FIG. 8 is a diagram illustrating operation timings of a fourth horizontal scanning period H4. Detailed description concerning operation similar to the operation illustrated in FIG. 5 will be omitted. The fourth horizontal scanning period H4 is a horizontal scanning period H for writing the video voltage Vvidp to the pixels PX in the fourth row. In the fourth horizontal scanning period H4, a potential of the scan signal G4 to be supplied to the scan line 120 in the fourth row is set to a high level. The scan signals G1 to G3 and G5 to G2160 to be supplied to the scan lines 120 in rows other than the fourth row are maintained at a low level.

The fourth horizontal scanning period H4 is different from each horizontal scanning period H from the first horizontal scanning period H1 to the third horizontal scanning period H3 in the order when the image signal S is supplied in order to the signal line 122 of each series from the first series to the eighth series. For example, each high level period of the write selection signals SEL1 to SEL8 is switched in order of the write selection signals SEL4 to SEL8 and SEL1 to SEL3. Specifically, the control circuit 280 makes the signal line 122 to be supplied with the image signal S in the first supply period different in four horizontal scanning periods H. Furthermore, the control circuit 280 makes the signal line 122 to be supplied with the image signal S in the last supply period different in four horizontal scanning periods H.

Each high level period of the pre-charge selection signals PSEL5 to PSEL8 and PSEL1 to PSEL3 is switched in order in accordance with the switching of each high level period of the write selection signals SEL4 to SEL8 and SEL1 to SEL2. For example, the pre-charge selection signal PSEL5 changes to a high level in synchronization with the timing when the write selection signal SEL4 changes to a high level, and then changes to a low level after a prescribed time period elapses. Furthermore, for example, the pre-charge selection signal PSEL3 changes to a high level in synchronization with the timing when the write selection signal SEL2 changes to a high level, and then changes to a low level after a prescribed time period elapses. Note that the pre-charge selection signal PSEL4 is maintained at a low level.

Therefore, in the fourth horizontal scanning period H4, the counter noise effect fails to be achieved in the supply period of the fourth series that is the first supply period and the supply period of the third series that is the last supply period. In contrast, the counter noise effect can be achieved in the supply periods from the fifth series to the eighth series, the supply period of the first series, and the supply period of the second series. For this reason, the control circuit 280 lengthens a length T1 of the supply period of the fourth series and a length T3 of the supply period of the third series to be longer than a length T2 of each supply period of the supply periods from the fifth series to the eighth series, the supply period of the first series, and the supply period of the second series. As a result, each pixel PX of each series can accurately display the gray scale specified by the image signal S. Note that the supply periods from the fifth series to the eighth series, the supply period of the first series, and the supply period of the second series illustrated in FIG. 8 represent one example of prescribed supply periods.

Furthermore, the electro-optical device 1 makes the signal line 122 to be supplied with the image signal S in the first supply period different in four horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the electro-optical device 1 makes the signal line 122 to be supplied with the image signal S in the last supply period different in four horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Figure 9:
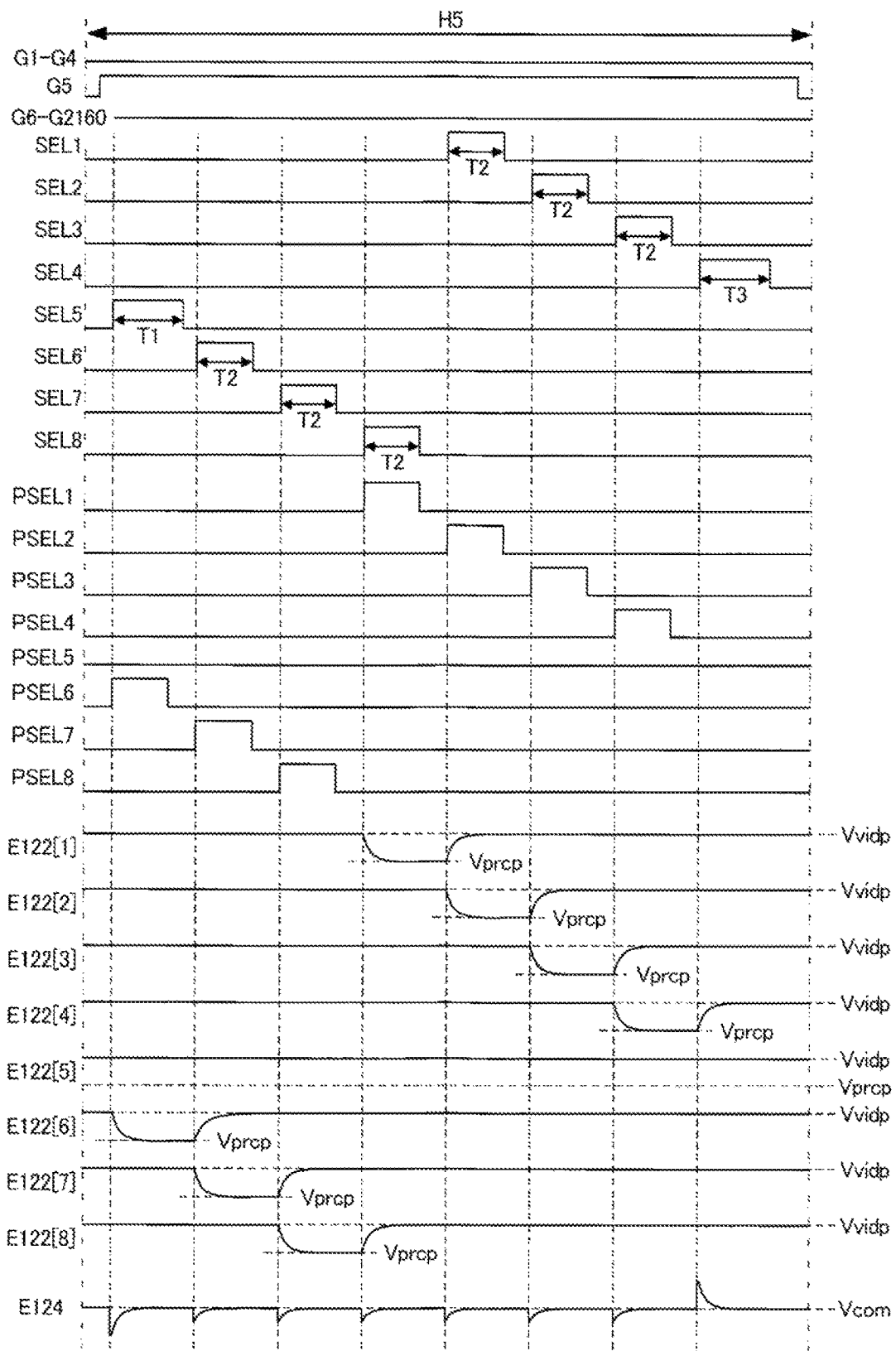
FIG. 9 is a diagram illustrating operation timings during a fifth horizontal scanning period.

FIG. 9 is a diagram illustrating operation timings of a fifth horizontal scanning period H5. Detailed description concerning operation similar to the operation illustrated in FIG. 5 will be omitted. The fifth horizontal scanning period H5 is a horizontal scanning period H for writing the video voltage Vvidp to the pixels PX in the fifth row. In the fifth horizontal scanning period H5, a potential of the scan signal G5 to be supplied to the scan line 120 in the fifth row is set to a high level. The scan signals G1 to G4 and G6 to G2160 to be supplied to the scan lines 120 in rows other than the fifth row are maintained at a low level.

The fifth horizontal scanning period H5 is different from each horizontal scanning period H from the first horizontal scanning period H1 to the fourth horizontal scanning period H4 in the order when the image signal S is supplied in order to the signal line 122 of each series from the first series to the eighth series. For example, each high level period of the write selection signals SEL1 to SEL8 is switched in order of the write selection signals SEL5 to SEL8 and SEL1 to SEL4. Specifically, the control circuit 280 makes the signal line 122 to be supplied with the image signal S in the first supply period different in five horizontal scanning periods H. Furthermore, the control circuit 280 makes the signal line 122 to be supplied with the image signal S in the last supply period different in five horizontal scanning periods H.

Each high level period of the pre-charge selection signals PSEL6 to PSEL8 and PSEL1 to PSEL4 is switched in order in accordance with the switching of each high level period of the write selection signals SEL5 to SEL8 and SEL1 to SEL3. For example, the pre-charge selection signal PSEL6 changes to a high level in synchronization with the timing when the write selection signal SEL5 changes to a high level, and then changes to a low level after a prescribed time period elapses. Furthermore, for example, the pre-charge selection signal PSEL4 changes to a high level in synchronization with the timing when the write selection signal SEL3 changes to a high level, and then changes to a low level after a prescribed time period elapses. Note that the pre-charge selection signal PSEL5 is maintained at a low level.

Therefore, in the fifth horizontal scanning period H5, the counter noise effect fails to be achieved in the supply period of the fifth series that is the first supply period and the supply period of the fourth series that is the last supply period. In contrast, the counter noise effect can be achieved in the supply periods from the sixth series to the eighth series and the supply periods from the first series to the third series. For this reason, the control circuit 280 lengthens a length T1 of the supply period of the fifth series and a length T3 of the supply period of the fourth series to be longer than a length T2 of each supply period of the supply periods from the sixth series to the eighth series and the supply periods from the first series to the third series. As a result, each pixel PX of each series can accurately display the gray scale specified by the image signal S. Note that the supply periods from the sixth series to the eighth series and the supply periods from the first series to the third series illustrated in FIG. 9 represent one example of prescribed supply periods.

Furthermore, the electro-optical device 1 makes the signal line 122 to be supplied with the image signal S in the first supply period different in five horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the electro-optical device 1 makes the signal line 122 to be supplied with the image signal S in the last supply period different in five horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Figure 10:
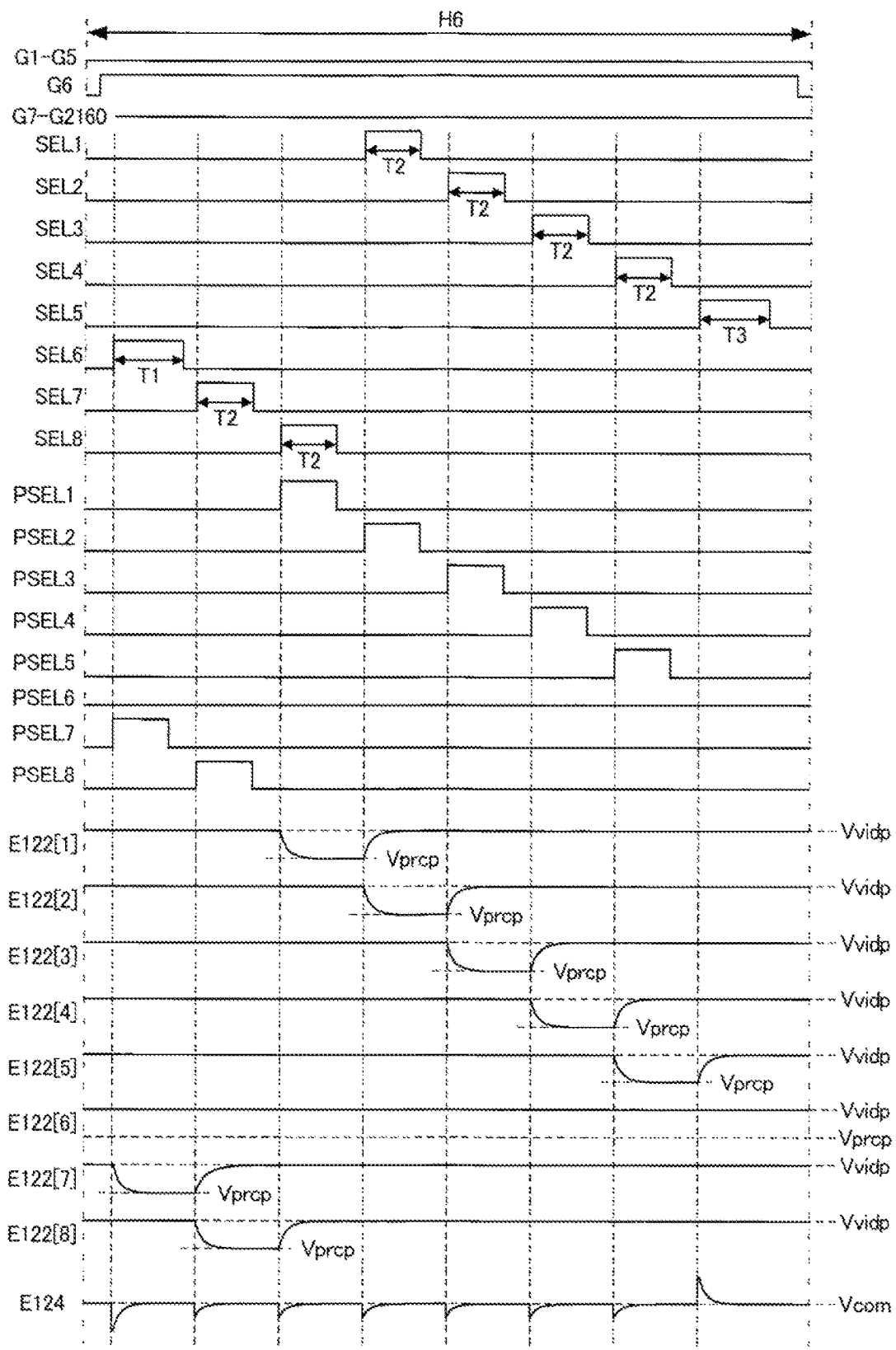
FIG. 10 is a diagram illustrating operation timings during a sixth horizontal scanning period.

FIG. 10 is a diagram illustrating operation timings of a sixth horizontal scanning period H6. Detailed description concerning operation similar to the operation illustrated in FIG. 5 will be omitted. The sixth horizontal scanning period H6 is a horizontal scanning period H for writing the video voltage Vvidp to the pixels PX in the sixth row. In the sixth horizontal scanning period H6, a potential of the scan signal G6 to be supplied to the scan line 120 in the sixth row is set to a high level. The scan signals G1 to G5 and G7 to G2160 to be supplied to the scan lines 120 in rows other than the sixth row are maintained at a low level.

The sixth horizontal scanning period H6 is different from each horizontal scanning period H from the first horizontal scanning period H1 to the fifth horizontal scanning period H5 in the order when the image signal S is supplied in order to the signal line 122 of each series from the first series to the eighth series. For example, each high level period of the write selection signals SEL1 to SEL8 is switched in order of the write selection signals SEL6 to SEL8 and SEL1 to SEL5. Specifically, the control circuit 280 makes the signal line 122 to be supplied with the image signal S in the first supply period different in six horizontal scanning periods H. Furthermore, the control circuit 280 makes the signal line 122 to be supplied with the image signal S in the last supply period different in six horizontal scanning periods H.

Each high level period of the pre-charge selection signals PSEL7, PSEL8, and PSEL1 to PSEL5 is switched in order in accordance with the switching of each high level period of the write selection signals SEL6 to SEL8 and SEL1 to SEL4. For example, the pre-charge selection signal PSEL7 changes to a high level in synchronization with the timing when the write selection signal SEL6 changes to a high level, and then changes to a low level after a prescribed time period elapses. Furthermore, for example, the pre-charge selection signal PSEL5 changes to a high level in synchronization with the timing when the write selection signal SEL4 changes to a high level, and then changes to a low level after a prescribed time period elapses. Note that the pre-charge selection signal PSEL6 is maintained at a low level.

Therefore, in the sixth horizontal scanning period H6, the counter noise effect fails to be achieved in the supply period of the sixth series that is the first supply period and the supply period of the fifth series that is the last supply period. In contrast, the counter noise effect can be achieved in the supply period of the seventh series, the supply period of the eight series, and the supply periods from the first series to the fourth series. For this reason, the control circuit 280 lengthens a length T1 of the supply period of the sixth series and a length T3 of the supply period of the fifth series to be longer than a length T2 of each supply period of the supply period of the seventh series, the supply period of the eighth series, and the supply periods from the first series to the fourth series. As a result, each pixel PX of each series can accurately display the gray scale specified by the image signal S. Note that the supply period of the seventh series, the supply period of the eighth series, and the supply periods from the first series to the fourth series illustrated in FIG. 10 represent one example of prescribed supply periods.

Furthermore, the electro-optical device 1 makes the signal line 122 to be supplied with the image signal S in the first supply period different in six horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the electro-optical device 1 makes the signal line 122 to be supplied with the image signal S in the last supply period different in six horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Figure 11:
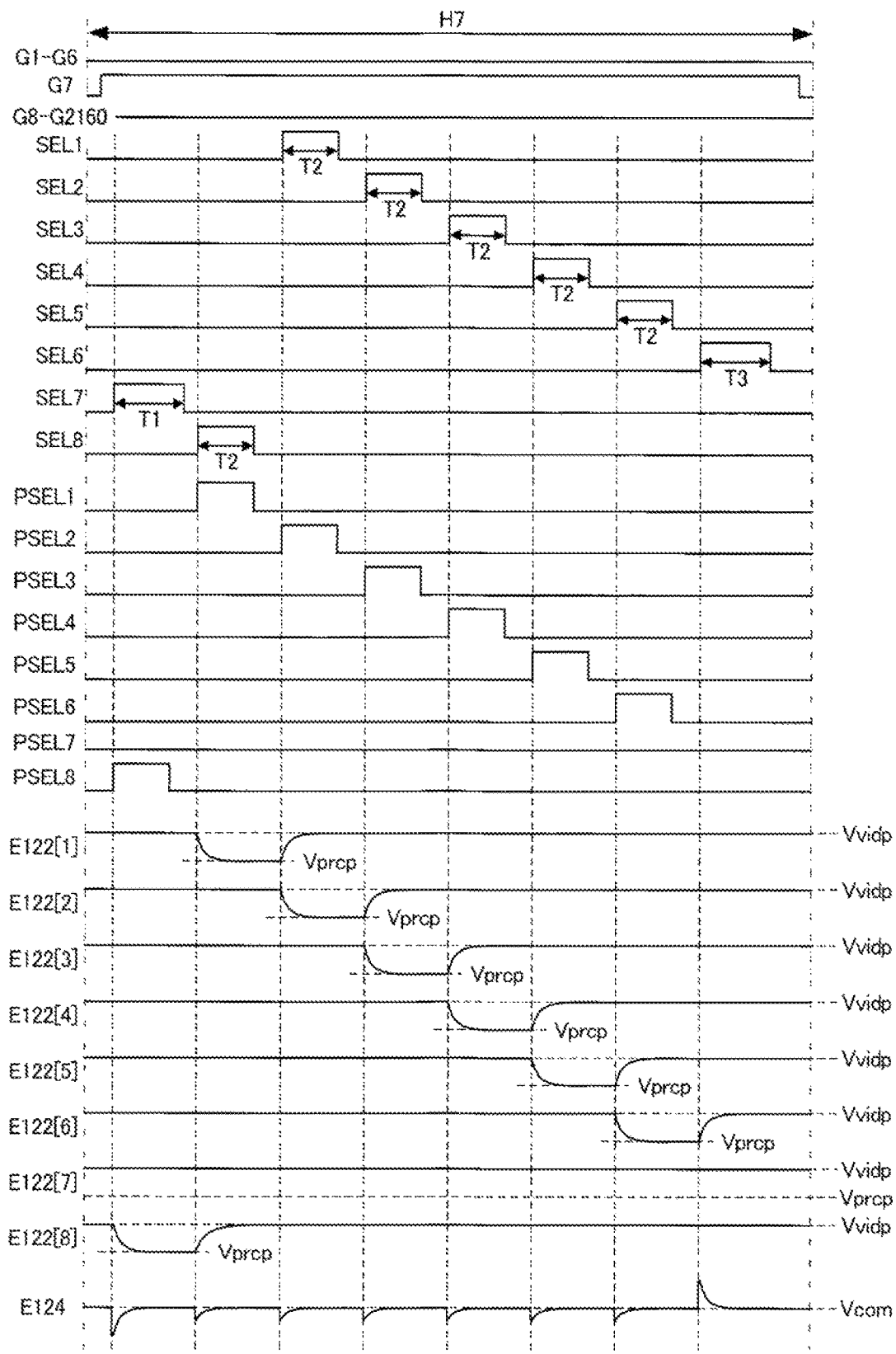
FIG. 11 is a diagram illustrating operation timings during a seventh horizontal scanning period.

FIG. 11 is a diagram illustrating operation timings of a seventh horizontal scanning period H7. Detailed description concerning operation similar to the operation illustrated in FIG. 5 will be omitted. The seventh horizontal scanning period H7 is a horizontal scanning period H for writing the video voltage Vvidp to the pixels PX in the seventh row. In the seventh horizontal scanning period H7, a potential of the scan signal G7 to be supplied to the scan line 120 in the seventh row is set to a high level. The scan signals G1 to G6 and G8 to G2160 to be supplied to the scan lines 120 in rows other than the seventh row are maintained at a low level.

The seventh horizontal scanning period H7 is different from each horizontal scanning period H from the first horizontal scanning period H1 to the sixth horizontal scanning period H6 in the order when the image signal S is supplied in order to the signal line 122 of each series from the first series to the eighth series. For example, each high level period of the write selection signals SEL1 to SEL8 is switched in order of the write selection signals SEL7, SEL8, and SEL1 to SEL6. Specifically, the control circuit 280 makes the signal line 122 to be supplied with the image signal S in the first supply period different in seven horizontal scanning periods H. Furthermore, the control circuit 280 makes the signal line 122 to be supplied with the image signal S in the last supply period different in seven horizontal scanning periods H.

Each high level period of the pre-charge selection signals PSEL8 and PSEL1 to PSEL6 is switched in order in accordance with the switching of each high level period of the write selection signals SEL7, SEL8, and SEL1 to SEL5. For example, the pre-charge selection signal PSEL8 changes to a high level in synchronization with the timing when the write selection signal SEL7 changes to a high level, and then changes to a low level after a prescribed time period elapses. Furthermore, for example, the pre-charge selection signal PSEL6 changes to a high level in synchronization with the timing when the write selection signal SEL5 changes to a high level, and then changes to a low level after a prescribed time period elapses. Note that the pre-charge selection signal PSEL7 is maintained at a low level.

Therefore, in the seventh horizontal scanning period H7, the counter noise effect fails to be achieved in the supply period of the seventh series that is the first supply period and the supply period of the sixth series that is the last supply period. In contrast, the counter noise effect can be achieved in the supply period of the eighth series and the supply periods from the first series to the fifth series. For this reason, the control circuit 280 lengthens a length T1 of the supply period of the seventh series and a length T3 of the supply period of the sixth series to be longer than a length T2 of each supply period of the supply period of the eighth series and the supply periods from the first series to the fifth series. As a result, each pixel PX of each series can accurately display the gray scale specified by the image signal S. Note that the supply period of the eighth series and the supply periods from the first series to the fifth series illustrated in FIG. 11 represent one example of prescribed supply periods.

Furthermore, the electro-optical device 1 makes the signal line 122 to be supplied with the image signal S in the first supply period different in seven horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the electro-optical device 1 makes the signal line 122 to be supplied with the image signal S in the last supply period different in seven horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Figure 12:
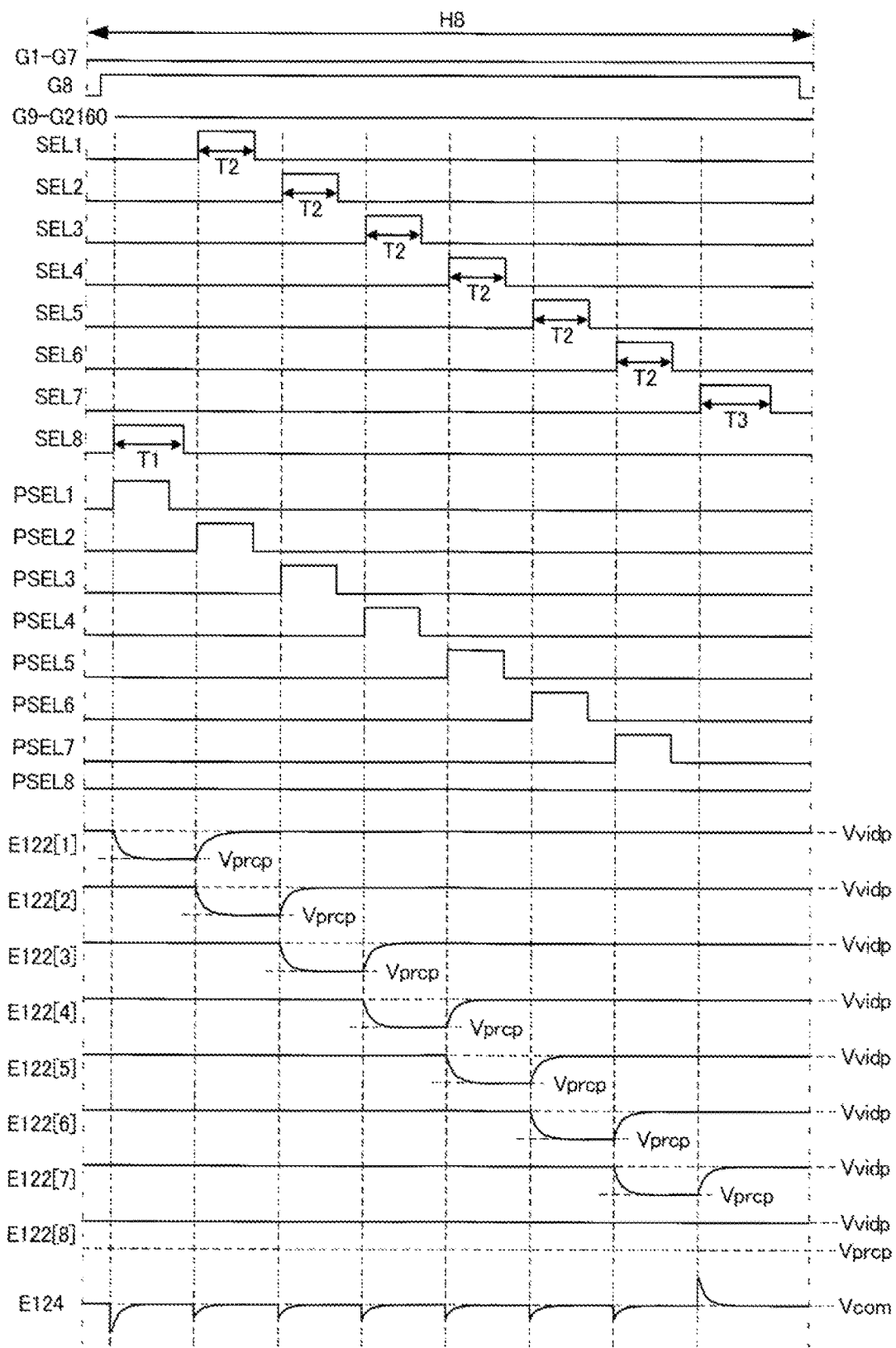
FIG. 12 is a diagram illustrating operation timings during an eighth horizontal scanning period.

FIG. 12 is a diagram illustrating operation timings of an eighth horizontal scanning period H8. Detailed description concerning operation similar to the operation illustrated in FIG. 5 will be omitted. The eighth horizontal scanning period H8 is a horizontal scanning period H for writing the video voltage Vvidp to the pixels PX in the eighth row. In the eighth horizontal scanning period H8, a potential of the scan signal G8 to be supplied to the scan line 120 in the eighth row is set to a high level. The scan signals G1 to G7 and G9 to G2160 to be supplied to the scan lines 120 in rows other than the eighth row are maintained at a low level.

The eighth horizontal scanning period H8 is different from each horizontal scanning period H from the first horizontal scanning period H1 to the seventh horizontal scanning period H7 in the order when the image signal S is supplied in order to the signal line 122 of each series from the first series to the eighth series. For example, each high level period of the write selection signals SEL1 to SEL8 is switched in order of the write selection signals SEL8 and SEL1 to SEL7. Specifically, the control circuit 280 makes the signal line 122 to be supplied with the image signal S in the first supply period different in eight horizontal scanning periods H. Furthermore, the control circuit 280 makes the signal line 122 to be supplied with the image signal S in the last supply period different in eight horizontal scanning periods H. Specifically, the control circuit 280 makes the signal line 122 to be supplied with the image signal S in the first supply period different in k horizontal scanning periods H, and makes the signal line 122 to be supplied with the image signal S in the last supply period different in the k horizontal scanning periods H.

Each high level period of the pre-charge selection signals PSEL1 to PSEL7 is switched in order in accordance with the switching of each high level period of the write selection signals SEL8 and SEL1 to SEL6. For example, the pre-charge selection signal PSEL1 changes to a high level in synchronization with the timing when the write selection signal SEL8 changes to a high level, and then changes to a low level after a prescribed time period elapses. Furthermore, for example, the pre-charge selection signal PSEL7 changes to a high level in synchronization with the timing when the write selection signal SEL6 changes to a high level, and then changes to a low level after a prescribed time period elapses. Note that the pre-charge selection signal PSEL8 is maintained at a low level.

Therefore, in the eighth horizontal scanning period H8, the counter noise effect fails to be achieved in the supply period of the eighth series that is the first supply period and the supply period of the seventh series that is the last supply period. In contrast, the counter noise effect can be achieved in the supply periods from the first series to the sixth series. For this reason, the control circuit 280 lengthens a length T1 of the supply period of the eighth series and a length T3 of the supply period of the seventh series to be longer than a length T2 of each of the supply periods from the first series to the sixth series. As a result, each pixel PX of each series can accurately display the gray scale specified by the image signal S. Note that the supply periods from the first series to the sixth series illustrated in FIG. 12 represent one example of prescribed supply periods.

Furthermore, the electro-optical device 1 makes the signal line 122 to be supplied with the image signal S in the first supply period different in eight horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the electro-optical device 1 makes the signal line 122 to be supplied with the image signal S in the last supply period different in eight horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Specifically, according to the operation timings illustrated in FIG. 5 to FIG. 12, among the supply periods in which the image signal S is supplied to the signal line 122 of the series already supplied with the pre-charge signal PRC, the control circuit 280 lengthens a supply period not including a period overlapping the pre-charge period to be longer than a supply period including a period overlapping the pre-charge period. Furthermore, among the supply periods each including a period overlapping the pre-charge period, the control circuit 280 lengthens a supply period in which the image signal S is supplied to the signal line 122 of the series not supplied with the pre-charge signal PRC to be longer than a supply period in which the image signal S is supplied to the signal line 122 of the column already supplied with the pre-charge signal PRC.

A horizontal scanning period H other than the horizontal scanning period H from the first horizontal scanning period H1 to the eighth horizontal scanning period H8 employs similar operation timings to any of the operation timings illustrated in FIG. 5 to FIG. 12, except for the scan signal G to select a row of the pixels PX to which the video voltage Vvidp is written. Note that the vertical scanning period may include a horizontal scanning period H that operates with operation timings different from the operation timings illustrated in FIG. 5 to FIG. 12, such as a horizontal scanning period H in which pre-charging is not carried out.

Operation timings of each horizontal scanning period H of the electro-optical device 1 when the raster display is carried out by means of negative polarity driving may be described by respectively replacing the video voltage Vvidp and the pre-charge voltage Vprcp with a video voltage and a pre-charge voltage in a case of the negative polarity driving in the description of FIG. 5 to FIG. 12. In the case of the negative polarity driving, the potential E122 of the signal line 122 is hardly fluctuated depending on the gray scales.

Figure 13:
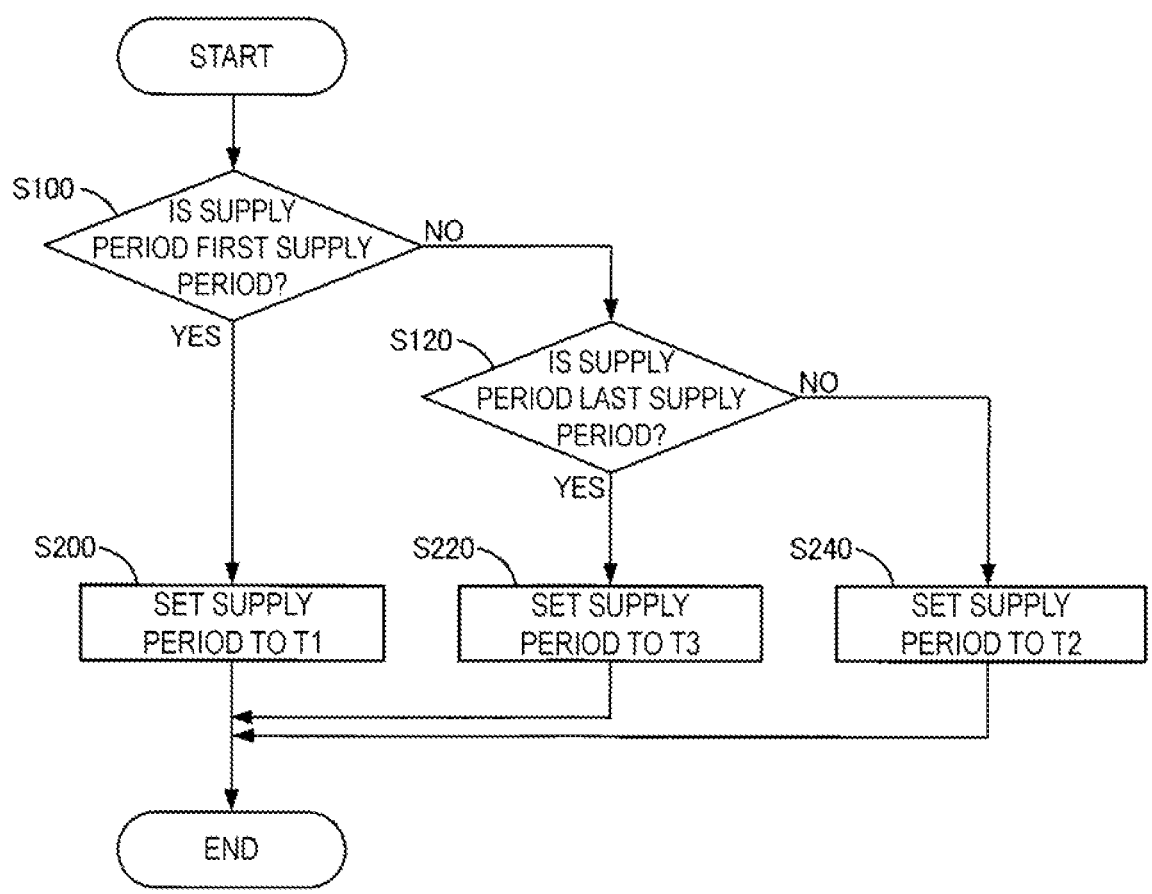
FIG. 13 is a flowchart illustrating an example of operation of the electro-optical device according to the first embodiment.

FIG. 13 is a flowchart illustrating one example of the operation of the electro-optical device 1 according to the first exemplary embodiment. The operation illustrated in FIG. 13 represents one example of a drive method of the electro-optical device 1. Note that the operation illustrated in FIG. 13 represents one example of a drive method of the electro-optical device 1 when the electro-optical device 1 sets each length of eight supply periods, i.e., k supply periods, in each horizontal scanning period H. The electro-optical device 1 repeats the operation illustrated in FIG. 13 until the electro-optical device 1 sets all of the lengths of the k supply periods in each horizontal scanning period H.

First, in Step S100, the electro-optical device 1 determines whether a supply period of the signal line 122 to be driven is the first supply period of k supply periods. In a case where the supply period of the signal line 122 to be driven is the first supply period, the electro-optical device 1 sets the supply period of the signal line 122 to be driven to a length T1 in Step S200. On the other hand, in a case where the supply period of the signal line 122 to be driven is not the first supply period, the operation of the electro-optical device 1 proceeds to Step S120.

In Step S120, the electro-optical device 1 determines whether the supply period of the signal line 122 to be driven is the last supply period of the k supply periods. In a case where the supply period of the signal line 122 to be driven is the last supply period, the electro-optical device 1 sets the supply period of the signal line 122 to be driven to a length T3 in Step S220. On the other hand, in a case where the supply period of the signal line 122 to be driven is not the last supply period, the electro-optical device 1 sets the supply period of the signal line 122 to be driven to a length T2 that is shorter than the lengths T1 and T3 in Step S240.

Specifically, in each horizontal scanning period H, the electro-optical device 1 lengthens the first supply period and the last supply period of the k supply periods in which the image signal S is supplied in order to each of k signal lines 122 to be longer than one or more prescribed supply periods except the first supply period and the last supply period of the k supply periods.

Note that the operation of the electro-optical device 1 is not limited to the example illustrated in FIG. 13. For example, Steps S120 and S220 may be omitted. Alternatively, Steps S100 and S200 may be omitted. Specifically, in each horizontal scanning period H, the electro-optical device 1 may lengthen one of the first supply period and the last supply period of the k supply periods to be longer than one or more prescribed supply periods except the first supply period and the last supply period of the k supply periods.

As described above, in the first exemplary embodiment, in each horizontal scanning period H, the control circuit 280 lengthens the first supply period and the last supply period of the k supply periods in which the image signal S is supplied in order to each of k signal lines 122 to be longer than one or more prescribed supply periods except the first supply period and the last supply period of the k supply periods.

For example, the prescribed supply period is a supply period in which the image signal S is supplied to the signal line 122 already supplied with the pre-charge signal PRC, and includes a period overlapping the pre-charge period in which the pre-charge signal PRC is supplied to another signal line 122. Therefore, in the prescribed supply period, the counter noise effect of canceling out the noise overlapping the capacitor line 124 can be achieved.

Note that, as described above, the first supply period and the last supply period in which the counter noise effect fails to be achieved are set to be longer than the prescribed supply period in which the counter noise effect can be achieved. As a result, the electro-optical device 1 can suppress ending of the first supply period and the last supply period in which the counter noise effect fails to be achieved before stabilization of the capacitor line 124. Therefore, the gray scale specified by the image signal S can be accurately displayed even in the pixels PX supplied with the image signals S in the first supply period and the last supply period. Specifically, the electro-optical device 1 can suppress occurrence of display unevenness, and can thus enhance display quality.

Note that, even when one of the first supply period and the last supply period is lengthened to be longer than one or more prescribed supply periods except the first supply period and the last supply period of the k supply periods, occurrence of display unevenness can be suppressed as compared to a case in which the length of the supply period is not adjusted. Specifically, display quality of the electro-optical device 1 can be enhanced.

Furthermore, the control circuit 280 makes the signal line 122 to be supplied with the image signal S in the first supply period different between two horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the control circuit 280 makes the signal line 122 to be supplied with the image signal S in the last supply period different between two horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Furthermore, the control circuit 280 makes the signal line 122 to be supplied with the image signal S in the first supply period different in k horizontal scanning periods H. Therefore, even when the gray scale is not accurately displayed in the pixels PX supplied with the image signal S in the first supply period, fixing of a column of the pixels PX in which the gray scale is not accurately displayed can be suppressed. Similarly, the control circuit 280 makes the signal line 122 to be supplied with the image signal S in the last supply period different in k horizontal scanning periods H. Therefore, even when the gray scale is not accurately displayed in the pixels PX supplied with the image signal S in the last supply period, fixing of a column of the pixels PX in which the gray scale is not accurately displayed can be suppressed.

Second Exemplary Embodiment

A configuration and an operation of an electro-optical device 1 according to a second exemplary embodiment are the same as the configuration and the operation of the electro-optical device 1 according to the first exemplary embodiment described above, except for timings when the control circuit 280 supplies the pre-charge signal PRC to the signal lines 122.

Figure 14:
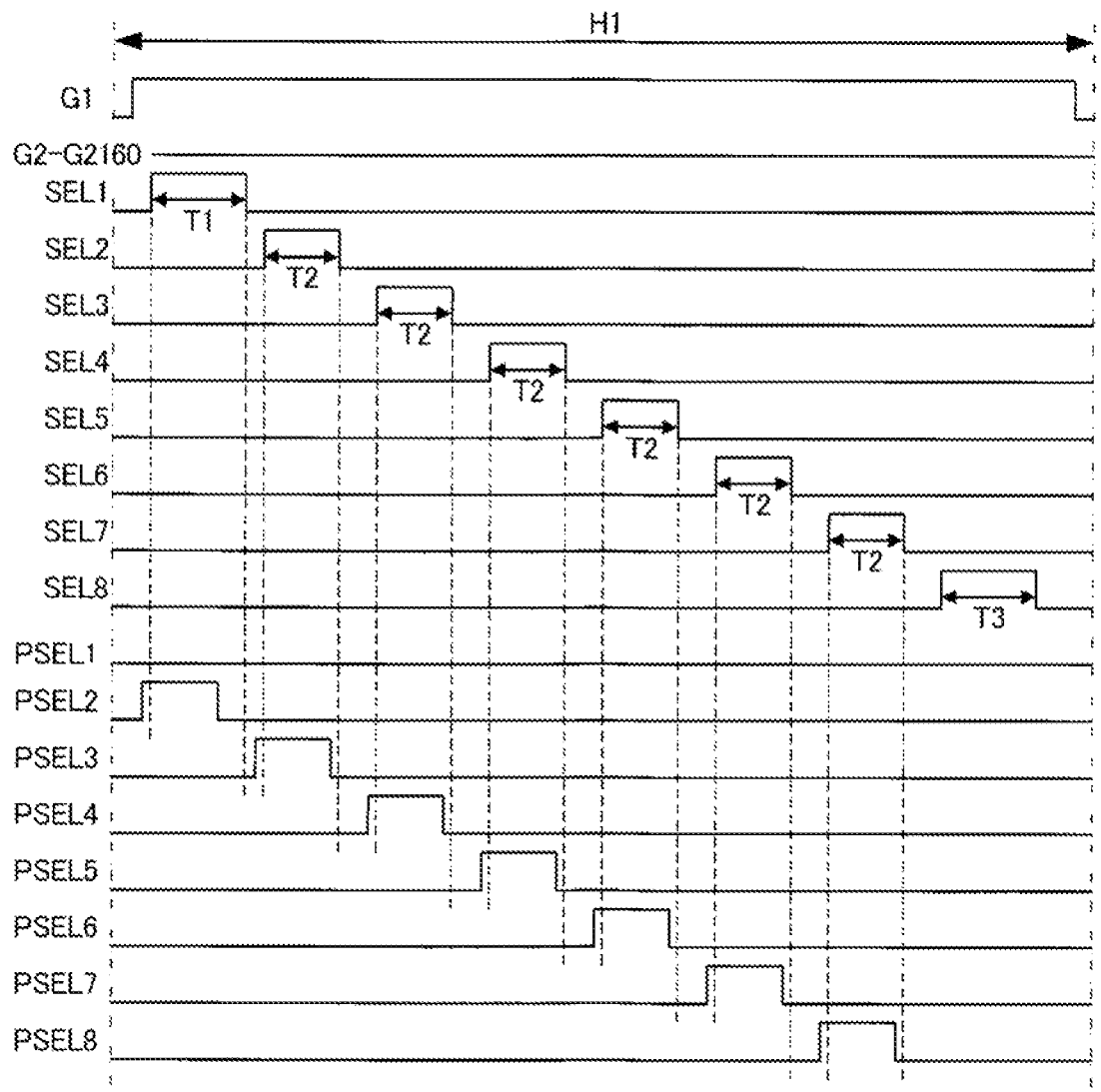
FIG. 14 is a diagram illustrating operation timings during a first horizontal scanning period in a second embodiment of the disclosure.

FIG. 14 is a diagram illustrating operation timings of a first horizontal scanning period H1 according to the second exemplary embodiment of the present disclosure. Detailed description concerning operation similar to the operation illustrated in FIG. 5 will be omitted.

Similarly to the operation timings illustrated in FIG. 5, in the first horizontal scanning period H1, each high level period of the write selection signals SEL1 to SEL8 is switched in order of the write selection signals SEL1 to SEL8. Furthermore, each high level period of the pre-charge selection signals PSEL2 to PSEL8 is switched in order in accordance with the switching of each high level period of the write selection signals SEL1 to SEL7. In the example illustrated in FIG. 14, order in which each high level period of the pre-charge selection signals PSEL2 to PSEL8 is switched is the same as the operation timings illustrated in FIG. 5, but switching timings are different from the operation timings illustrated in FIG. 5.

For example, similarly to the operation timings illustrated in FIG. 5, the pre-charge selection signal PSEL2 changes in synchronization with the write selection signal SEL1. Note that the pre-charge selection signal PSEL2 changes to a high level before the write selection signal SEL1 changes to a high level. Then, the pre-charge selection signal PSEL2 changes to a low level before the write selection signal SEL1 changes to a low level.

Furthermore, for example, similarly to the operation timings illustrated in FIG. 5, the pre-charge selection signal PSEL8 changes in synchronization with the write selection signal SEL7. Note that the pre-charge selection signal PSEL8 changes to a high level after the write selection signal SEL6 changes to a low level and before the write selection signal SEL7 changes to a high level. Then, the pre-charge selection signal PSEL8 changes to a low level before the write selection signal SEL7 changes to a low level. Each of the pre-charge selection signals PSEL3 to PSEL7 also changes at a timing similar to the timing of the pre-charge selection signal PSEL8 with respect to the write selection signal SEL to be synchronized with.

Specifically, in the second exemplary embodiment, the control circuit 280 causes a pre-charge period overlapping the first supply period to precede the first supply period while leaving a period overlapping the first supply period. Furthermore, the control circuit 280 causes a pre-charge period overlapping a prescribed supply period, such as a supply period of the second series, to precede the prescribed supply period while leaving a period overlapping the prescribed supply period.

In some cases, the counter noise effect fails to be sufficiently achieved in a case where drive capability of the pre-charge switches SWp is low. Therefore, in the second exemplary embodiment, the pre-charge period is caused to precede the supply period to secure time before the fluctuation of the potential E124 of the capacitor line 124 is moderated as compared to a case in which the pre-charge period is not caused to precede the supply period. As a result, ending of the supply period before stabilization of the potential E124 of the capacitor line 124 can be suppressed. Therefore, each pixel PX can accurately display the gray scale specified by the image signal S.

MODIFICATION EXAMPLES

Each of the exemplary embodiments exemplified in the above can be variously modified. Specific modification modes are exemplified below. Two or more modes freely selected from exemplifications below can be appropriately used in combination as long as mutual contradiction does not arise.

First Modification Example

Figure 15:
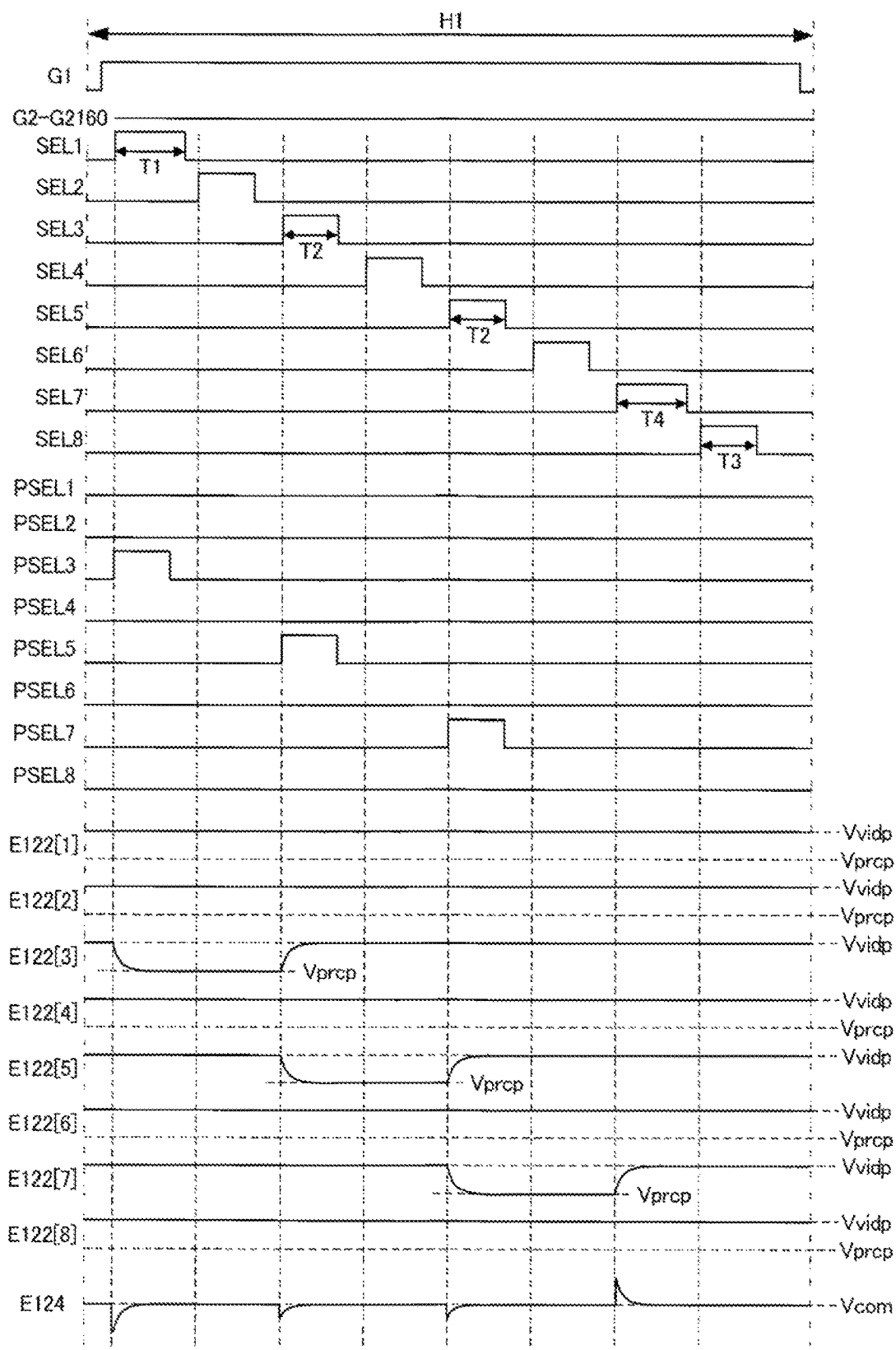
FIG. 15 is a diagram illustrating operation timings during the first horizontal scanning period in Modified Example 1 of the first embodiment.
Figure 16:
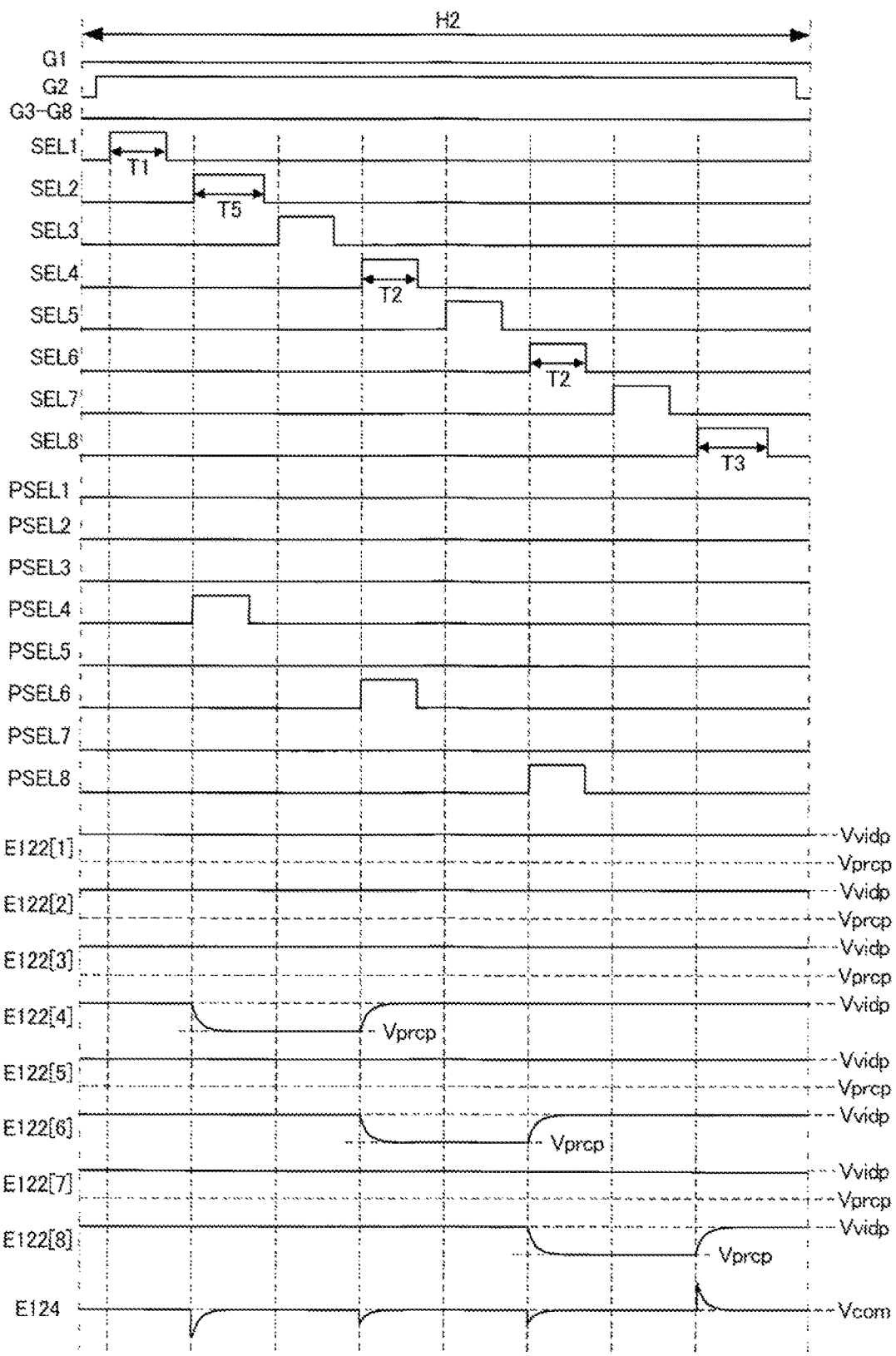
FIG. 16 is a diagram illustrating operation timings during the second horizontal scanning period in Modified Example 1.

FIG. 15 and FIG. 16 are each a diagram illustrating operation timings of the electro-optical device 1 according to the first modification example of the first exemplary embodiment. Note that FIG. 15 and FIG. 16 each illustrates operation timings of the electro-optical device 1 in a case where raster display is performed by positive polarity driving. In the first modification example, pre-charging is carried out in every other supply period. Specifically, it is sufficient that pre-charging be carried out in accordance with one or more prescribed supply periods except the last supply period of k supply periods. In the examples illustrated in FIG. 15 and FIG. 16, the pre-charge circuit 160 supplies the pre-charge signal PRC to one signal line 122 of k signal lines 122 in each of h pre-charge periods corresponding to first to (k−1)-th supply periods of the k supply periods included in the horizontal scanning period H. Note that "h" represents an integer of 2 or more and k−1 or less. Furthermore, the control circuit 280 lengthens a supply period of the k supply periods included in the horizontal scanning period H that corresponds to the first pre-charge period to be longer than a supply period that corresponds to the second pre-charge period.

FIG. 15 is a diagram illustrating operation timings of a first horizontal scanning period H1 according to the first modification example of the first exemplary embodiment. Detailed description concerning operation similar to the operation illustrated in FIG. 5 will be omitted.

Similarly to the operation timings illustrated in FIG. 5, in the first horizontal scanning period H1, each high level period of the write selection signals SEL1 to SEL8 is switched in order of the write selection signals SEL1 to SEL8. Furthermore, each high level period of the pre-charge selection signals PSEL3, PSEL5, and PSEL7 is switched in order in accordance with the switching of each high level period of the write selection signals SEL1, SEL3, and SEL5. Specifically, in the first horizontal scanning period H1 of the first modification example, the pre-charge signal PRC is supplied in order to the signal lines 122 of series having odd numbers.

For example, the pre-charge selection signal PSEL3 changes to a high level in synchronization with the timing when the write selection signal SEL1 changes to a high level, and then changes to a low level after a prescribed time period elapses. Furthermore, for example, the pre-charge selection signal PSEL5 changes to a high level in synchronization with the timing when the write selection signal SEL3 changes to a high level, and then changes to a low level after a prescribed time period elapses. Furthermore, for example, the pre-charge selection signal PSEL7 changes to a high level in synchronization with the timing when the write selection signal SEL5 changes to a high level, and then changes to a low level after a prescribed time period elapses. Note that the pre-charge selection signals PSEL1, PSEL2, PSEL4, PSEL6, and PSEL8 are maintained at a low level.

Therefore, in the first horizontal scanning period H1 of the first modification example, the counter noise effect fails to be achieved in the supply period of the first series that is the first supply period and the supply period of the seventh series that is the last supply period of the series having odd numbers. In contrast, the counter noise effect can be achieved in the supply period of the third series and the supply period of the fifth series. For this reason, the control circuit 280 lengthens a length T1 of the supply period of the first series and a length T4 of the supply period of the seventh series to be longer than a length T2 of each supply period of the supply period of the third series and the supply period of the fifth series. As a result, each pixel PX of each series can accurately display the gray scale specified by the image signal S. Note that the supply period of the third series and the supply period of the fifth series illustrated in FIG. 15 represent one example of prescribed supply periods.

Furthermore, in the case of the raster display, in the supply periods of series having even numbers of the first horizontal scanning period H1 of the first modification example, the potential E122 of the signal lines 122 hardly changes, and accordingly the potential E124 of the capacitor lines 124 also hardly changes. Therefore, a length of the supply period of the series having even numbers, such as a length T3 of the supply period of the eighth series that is the last supply period, may be equal to the length T2 of each supply period of the supply period of the third series and the supply period of the fifth series.

FIG. 16 is a diagram illustrating operation timings of a second horizontal scanning period H2 according to the first modification example. Detailed description concerning operation similar to the operation illustrated in FIG. 5 and FIG. 6 will be omitted.

Similarly to the operation timings illustrated in FIG. 5, in the second horizontal scanning period H2, each high level period of the write selection signals SEL1 to SEL8 is switched in order of the write selection signals SEL1 to SEL8. Furthermore, each high level period of the pre-charge selection signals PSEL4, PSEL6, and PSEL8 is switched in order in accordance with the switching of each high level period of the write selection signals SEL2, SEL4, and SEL6. Specifically, in the second horizontal scanning period H2 of the first modification example, the pre-charge signal PRC is supplied in order to the signal lines 122 of series having even numbers.

For example, the pre-charge selection signal PSEL4 changes to a high level in synchronization with the timing when the write selection signal SEL2 changes to a high level, and then changes to a low level after a prescribed time period elapses. Furthermore, for example, the pre-charge selection signal PSEL6 changes to a high level in synchronization with the timing when the write selection signal SEL4 changes to a high level, and then changes to a low level after a prescribed time period elapses. Furthermore, for example, the pre-charge selection signal PSEL8 changes to a high level in synchronization with the timing when the write selection signal SEL6 changes to a high level, and then changes to a low level after a prescribed time period elapses. Note that the pre-charge selection signals PSEL1, PSEL2, PSEL3, PSEL5, and PSEL7 are maintained at a low level.

Therefore, in the second horizontal scanning period H2 of the first modification example, the counter noise effect fails to be achieved in the supply period of the second series that is the first supply period of the series having even numbers and the supply period of the eighth series that is the last supply period. In contrast, the counter noise effect can be achieved in the supply period of the fourth series and the supply period of the sixth series. For this reason, the control circuit 280 lengthens a length T5 of the supply period of the second series and a length T3 of the supply period of the eighth series to be longer than a length T2 of each supply period of the supply period of the fourth series and the supply period of the sixth series. As a result, each pixel PX of each series can accurately display the gray scale specified by the image signal S. Note that the supply period of the fourth series and the supply period of the sixth series illustrated in FIG. 15 represent one example of prescribed supply periods.

Furthermore, in the case of the raster display, in the supply periods of series having odd numbers in the second horizontal scanning period H2 of the first modification example, the potential E122 of the signal lines 122 hardly changes, and accordingly the potential E124 of the capacitor lines 124 also hardly changes. Therefore, a length of the supply period of the series having odd numbers, such as a length T1 of the supply period of the first series that is the first supply period, may be equal to the length T2 of each supply period of the supply period of the fourth series and the supply period of the sixth series.

Also in the first modification example, effects similar to the effects of the first exemplary embodiment described above can be achieved. Note that the first modification example may be applied to the second exemplary embodiment described above. Specifically, also in the first modification example, the control circuit 280 may cause a pre-charge period to precede the write selection signal SEL to be synchronized with, while leaving an overlapping period.

Also in the first modification example, the control circuit 280 may make the signal line 122 to be supplied with the image signal S in the first supply period of the series having odd numbers different in a plurality of horizontal scanning periods H. The control circuit 280 may make the signal line 122 to be supplied with the image signal S in the first supply period of the series having even numbers different in a plurality of horizontal scanning periods H. The control circuit 280 may make the signal line 122 to be supplied with the image signal S in the last supply period of the series having odd numbers different in a plurality of horizontal scanning periods H. The control circuit 280 may make the signal line 122 to be supplied with the image signal S in the last supply period of the series having even numbers different in a plurality of horizontal scanning periods H.

Second Modification Example

FIG. 2 described above illustrates an example in which the other ends of the pre-charge switches SWp1 to SWp4160 are coupled together. However, the relationship of the coupling of the other ends of the pre-charge switches SWp1 to SWp4160 is not limited to the example illustrated in FIG. 2. For example, the other ends of the pre-charge switches SWp coupled to the signal lines 122 in columns having odd numbers may be coupled together, and the other ends of the pre-charge switches SWp coupled to the signal lines 122 in columns having even numbers may be coupled together.

In this case, at the time of normal operation of the electro-optical device 1, the pre-charge voltage control circuit 260 supplies the pre-charge signal PRC to both the other ends of the pre-charge switches SWp coupled to the signal lines 122 in the columns having odd numbers and the other ends of the pre-charge switches SWp coupled to the signal lines 122 in the columns having even numbers. Note that, for example, at the time of testing the electro-optical device 1, a test circuit (not illustrated) electrically insulates the other ends of the pre-charge switches SWp coupled to the signal lines 122 in the columns having odd numbers from the other ends of the pre-charge switches SWp coupled to the signal lines 122 in the columns having even numbers. Then, the test circuit supplies a test signal having levels different from each other to the other ends of the pre-charge switches SWp coupled to the signal lines 122 in the columns having odd numbers and the other ends of the pre-charge switches SWp coupled to the signal lines 122 in the columns having even numbers. In this case, a short circuit or the like of signal lines 122 adjacent to each other can be easily detected.

Third Modification Example

FIG. 2 described above illustrates an example in which the plurality of signal lines 122 are divided into the signal line groups each including k signal lines 122. However, the plurality of signal lines 122 may not be divided into the plurality of signal line groups. For example, it is sufficient that the electro-optical device 1 include k signal lines 122 to be supplied with the image signals S in order. Specifically, in the block diagram illustrated in FIG. 2, the signal lines 122 and the pixels PX in the 9th column to the 4160th column, the write selecting circuits SUv other than the write selecting circuit SUv1, and the pre-charge selection circuits SUp other than the pre-charge selection circuit SUp1 may be omitted.

Fourth Modification Example

The first exemplary embodiment and the second exemplary embodiment described above exemplify a device using liquid crystals as an electro-optical device. However, the present disclosure is not limited to such a device. Specifically, it is sufficient to use an electro-optical device using an electro-optical material that changes optical characteristics depending on electric energy. Note that the electro-optical material refers to a material that changes optical characteristics, such as transmittance and luminance, depending on the supply of an electric signal, such as an electric current signal or a voltage signal. For example, the present disclosure can also be applied to a display panel using light-emitting devices such as organic ElectroLuminescent (EL) devices, inorganic EL devices, and light-emitting polymers, similarly to the first exemplary embodiment and the second exemplary embodiment described above.

Furthermore, the present disclosure can also be applied to an electrophoretic display panel that uses, as the electro-optical material, micro capsules each including colored liquid and white particles distributed in the liquid, similarly to the first exemplary embodiment and the second exemplary embodiment described above. Further, the present disclosure can also be applied to a twisting ball display panel that uses, as the electro-optical material, twisting balls each having different colors painted in areas having different polarities, similarly to the first exemplary embodiment and the second exemplary embodiment described above. The present disclosure can also be applied to various electro-optical devices, such as a toner display panel that uses black toner as the electro-optical material, similarly to the first exemplary embodiment and the second exemplary embodiment described above.

Modified Example 5

In the course of development of the disclosure, it has been found that noise resulting from an OFF operation of the pre-charge switch SWp (a transition operation from the conducting state to the non-conducting state) may cause the signal line 122 and the capacitance line 124 to be visually recognized as display unevenness under the effect of the noise.

In Modified Example 5, a method for suppressing occurrence of display unevenness will be described.

In FIG. 5 of the first embodiment described above, during the supply period for the first series, the second series of signal lines 122 is pre-charged during the pre-charge period for the second series. An end time of the supply period for the first series (timing immediately after the write selection signal SEL has changed to the low level) is later than an end time of the pre-charge period for the second series (timing immediately after the pre-charge selection signal PSEL has changed to the low level). On the other hand, the end time of the supply period for the second series and the end time of the pre-charge period for the third series are generally the same.

The inventors of the present application thus have found that in a case where the end time of a supply period for an n-th series (n is an integer of 1 or greater) is later than the end time of a pre-charge period for an (n+a)-th series (a is an integer of 1 or greater) executed during a period overlapping the supply period for the n-th series, noise resulting from the OFF operation of the pre-charge switch SWp more significantly affects the signal line 122 and the capacitance line 124 than noise in a case where the end time of the supply period for the n-th series is the same as the end time of the pre-charge period for the (n+a)-th series executed in such a manner as to overlap the supply period for the n-th series. Note that it has been found that the effect, on the signal line 122 and the capacitance line 124, of noise resulting from the OFF operation of the pre-charge switch SWp is also suppressed even in a case where the end time of the supply period for the n-th series is earlier than the end time of the pre-charge period for the (n+a)-th series executed in such a manner as to overlap the supply period for the n-th series.

Accordingly, for suppression of the effect of noise resulting from the OFF operation of the pre-charge switch SWp, in FIG. 5, the end time of the pre-charge period for the second series may be generally the same as the end time of the supply period for the first series. Similarly, in FIG. 6, the end time of the pre-charge period for the third series may be generally the same as the end time of the supply period for the second series. Similarly, in FIG. 7, the end time of the pre-charge period for the fourth series may be generally the same as the end time of the supply period for the third series. Similarly, in FIG. 8, the end time of the pre-charge period for the fifth series may be generally the same as the end time of the supply period for the fourth series. Similarly, in FIG. 9, the end time of the pre-charge period for the sixth series may be generally the same as the end time of the supply period for the fifth series. Similarly, in FIG. 10, the end time of the pre-charge period for the seventh series may be generally the same as the end time of the supply period for the sixth series. Similarly, in FIG. 11, the end time of the pre-charge period for the eighth series may be generally the same as the end time of the supply period for the seventh series. Similarly, in FIG. 12, the end time of the pre-charge period for the first series may be generally the same as the end time of the supply period for the eighth series.

As described above, the display unevenness can be suppressed by using the configuration in which a uniform time difference is set between the end time of a supply period for a certain series and the end time of a pre-charge period executed in such a manner as to overlap the supply period or the configuration in which the end time of a supply period is earlier than the end time of the pre-charge period executed in such a manner as to overlap the supply period.

Application Examples

Figure 17:
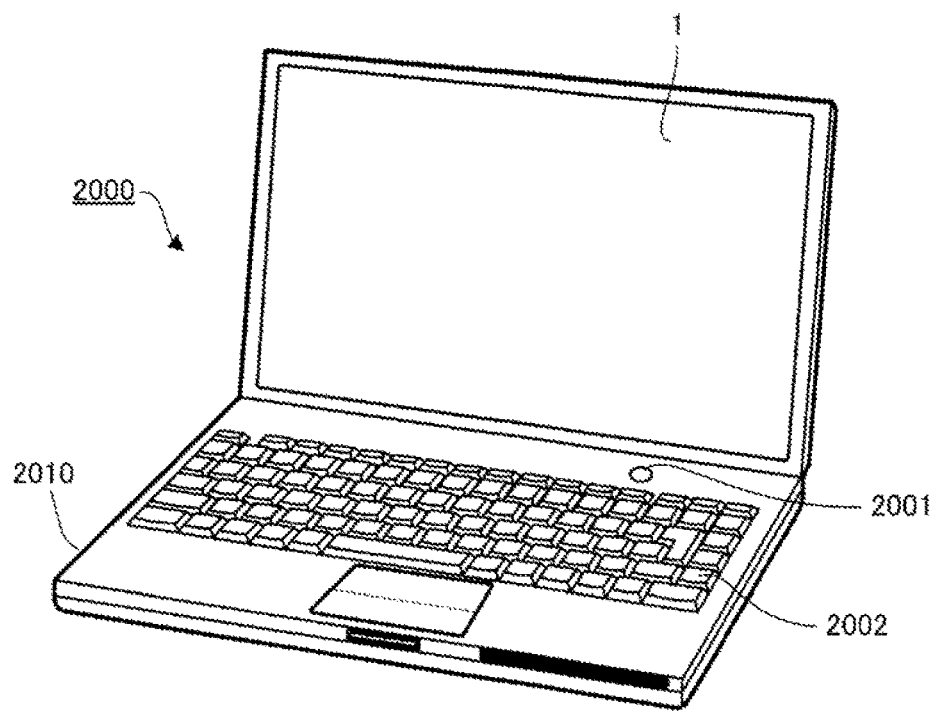
FIG. 17 is an explanatory diagram illustrating an example of an electronic apparatus.
Figure 18:
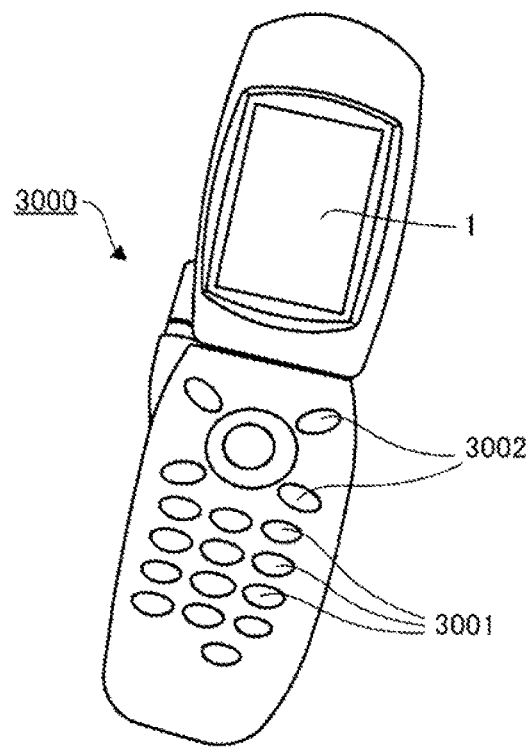
FIG. 18 is an explanatory diagram illustrating another example of the electronic apparatus.
Figure 19:
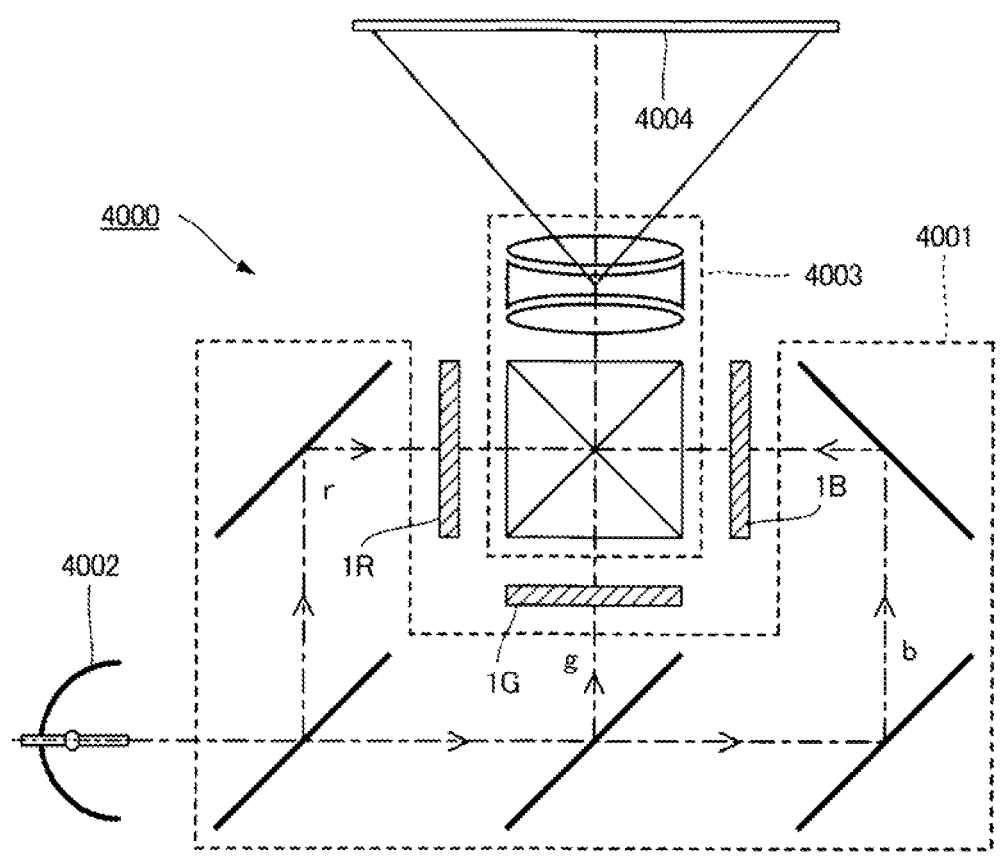
FIG. 19 is an explanatory diagram illustrating another example of the electronic apparatus.

The present disclosure can be used in various electronic devices. FIG. 17 to FIG. 19 exemplify specific modes of the electronic devices to which the present disclosure is applied.

FIG. 17 is an explanatory diagram illustrating one example of the electronic devices. Note that FIG. 17 is a perspective view of a portable personal computer 2000 adopting the electro-optical device 1. The personal computer 2000 includes the electro-optical device 1 configured to display various images, and a main body portion 2010 in which a power source switch 2001 and a keyboard 2002 are installed.

FIG. 18 is an explanatory diagram illustrating another example of the electronic devices. Note that FIG. 18 is a perspective view of a mobile phone 3000. The mobile phone 3000 includes a plurality of operation buttons 3001 and scroll buttons 3002, and the electro-optical device 1 configured to display various images. Operation of any of the scroll buttons 3002 causes a screen displayed on the electro-optical device 1 to be scrolled.

FIG. 19 is an explanatory diagram illustrating another example of the electronic devices. Note that FIG. 19 is a schematic view illustrating a configuration of a projection-type display device 4000 adopting the electro-optical device 1. The projection-type display device 4000 is a three-plate type projector, for example. An electro-optical device 1R illustrated in FIG. 19 is an electro-optical device 1 corresponding to a red display color, an electro-optical device 1G is an electro-optical device 1 corresponding to a green display color, and an electro-optical device 1B is an electro-optical device 1 corresponding to a blue display color.

Specifically, the projection-type display device 4000 includes three electro-optical devices 1R, 1G, and 1B that respectively correspond to display colors of red, green, and blue. An illumination optical system 4001 supplies a red element r of light emitted from an illumination device 4002 as a light source to the electro-optical device 1R, a green element g of the light to the electro-optical device 1G, and a blue element b of the light to the electro-optical device 1B. Each of the electro-optical devices 1R, 1G, and 1B functions as an optical modulator, such as a light bulb, that modulates respective rays of the monochromatic light supplied from the illumination optical system 4001 depending on display images. A projection optical system 4003 combines the rays of the light emitted from each of the electro-optical devices 1R, 1G, and 1B to project the combined light to a projection surface 4004. Specifically, the present disclosure can also be applied to a liquid crystal projector.

Note that, in addition to the examples of the devices illustrated in FIG. 1 and FIG. 17 to FIG. 19, examples of the electronic devices to which the present disclosure is applied include a Personal Digital Assistant (PDA). Other examples include a digital still camera, a television set, a video camera, a car navigation device, a display device (instrument panel) for in-vehicle use, an electronic organizer, electronic paper, an electronic calculator, a word processor, a workstation, a visual telephone, and a POS terminal. Other examples further include a device including a printer, a scanner, a copier, a video player, and a touch panel.

What is claimed is:

1. An electro-optical device comprising:
   a plurality of scan lines;
   k signal lines, k being an integer equal to or greater than 3;
   a reference line to which a reference potential is applied;
   a pixel that is disposed corresponding to each of intersections between the plurality of scan lines and the k signal lines and that includes a holding capacitor coupled to the reference line, the pixel holding, in the holding capacitor, a potential corresponding to an image signal;
   an image signal circuit configured to sequentially supply the image signal to the k signal lines during k supply periods of each of a plurality of repeated horizontal scanning periods based on k selection signals sequentially selecting the k signal lines;
   a pre-charge circuit configured to supply, in each horizontal scanning period and in a prescribed order, a pre-charge signal during a pre-charge period to a signal line of the k signal lines to which the image signal circuit has not supplied the image signal yet; and
   a control circuit configured to control the k selection signals in each horizontal scanning period such that at least one of a first supply period and a last supply period of the k supply periods, during which the image signal is sequentially supplied to each of the k signal lines, is longer than a prescribed supply period excluding the first supply period and the last supply period of the k supply periods for all of the horizontal scan periods,
   wherein the k supply periods are all of a same length except for the at least one of the first supply period and the last supply period.

2. The electro-optical device according to claim 1, wherein
   the control circuit is configured to control the k selection signals to set both the first supply period and the last supply period to be longer than the prescribed supply period.

3. The electro-optical device according to claim 1, wherein
   the prescribed supply period is a supply period during which the image signal is supplied to a signal line to which the pre-charge signal has already been supplied, and the prescribed supply period includes a period overlapping a pre-charge period during which the pre-charge signal is supplied to another signal line.

4. The electro-optical device according to claim 1, wherein
   the control circuit is configured to control the k selection signals such that the signal lines to which the image signal is supplied during the first supply period differ between two of the horizontal scanning periods.

5. The electro-optical device according to claim 1, wherein
   the control circuit is configured to control the k selection signals such that the signal lines to which the image signal is supplied during the first supply period differ among k of the horizontal scanning periods.

6. The electro-optical device according to claim 1, wherein
   the control circuit is configured to control the k selection signals such that the signal lines to which the image signal is supplied during the last supply period differ between two of the horizontal scanning periods.

7. The electro-optical device according to claim 1, wherein
   the control circuit is configured to control the k selection signals such that the signal lines to which the image signal is supplied during the last supply period differ among k of the horizontal scanning periods.

8. The electro-optical device according to claim 1, wherein
   the control circuit is configured to control the k selection signals such that a pre-charge period overlapping the first supply period is set to precede the first supply period, while leaving a period overlapping the first supply period, and such that a pre-charge period overlapping the prescribed supply period is set to precede the prescribed supply period, while leaving a period overlapping the first supply period.

9. The electro-optical device according to claim 1, wherein
   the control circuit is configured to control the k selection signals such that a supply period during which the image signal is supplied to a first signal line of the k signal lines is assigned to the first supply period during a first horizontal scanning period of two of the horizontal scanning periods and is assigned to the prescribed supply period during a second horizontal scanning period of the two of the horizontal scanning periods, and such that the first supply period is longer than the prescribed supply period, and
   the pre-charge circuit is configured to not supply the pre-charge signal to the first signal line during the first horizontal scanning period and supply the pre-charge signal to the first signal line during the second horizontal scanning period.

10. The electro-optical device according to claim 1, wherein an end time of the prescribed supply period is earlier than an end time of the pre-charge period overlapping the supply period.

11. The electro-optical device according to claim 1, wherein an end time of the prescribed supply period is earlier than an end time of the pre-charge period overlapping the supply period.

12. An electronic apparatus comprising the electro-optical device according to claim 1.

13. An electro-optical device comprising:
a plurality of scan lines;
a plurality of signal lines including k signal lines as a group, k being an integer equal to or greater than 3;
a reference line to which a reference potential is applied;
a pixel that is disposed corresponding to each of intersections between the plurality of scan lines and the plurality of signal lines and that includes a holding capacitor coupled to the reference line, the pixel holding, in the holding capacitor, a potential corresponding to an image signal;
an image signal circuit configured to supply the image signal to one signal line of the k signal lines during each of k supply periods of each of a plurality of repeated horizontal scanning periods;
a pre-charge circuit configured to supply a pre-charge signal to one signal line of the k signal lines during each of pre-charge periods corresponding to from a first to a (k−1)-th supply period of the k supply periods included in each horizontal scanning period; and
a control circuit configured to control the k supply periods included in each horizontal scanning period such that one of the first supply period and the k-th supply period of the k supply periods is longer than a supply period excluding the first supply period and the last supply period of the k supply periods for all of the horizontal scan periods,
wherein the k supply periods are all of a same length except for the at least one of the first supply period and the last supply period.

14. An electro-optical device comprising:
a plurality of scan lines;
a plurality of signal lines including k signal lines as a group, k being an integer equal to or greater than 3;
a reference line to which a reference potential is applied;
a pixel that is disposed corresponding to each of intersections between the plurality of scan lines and the plurality of signal lines and that includes a holding capacitor coupled to the reference line, the pixel holding, in the holding capacitor, a potential corresponding to an image signal;
an image signal circuit configured to supply the image signal to one signal line of the k signal lines during each of k supply periods of each of a plurality of repeated horizontal scanning periods;
a pre-charge circuit configured to supply a pre-charge signal to one signal line of the k signal lines during each of h pre-charge periods corresponding to from a first to a (k−1)-th supply period of the k supply periods included in each horizontal scanning period, h being an integer from 2 to k−1; and
a control circuit configured to control the k supply periods included in each horizontal scanning period such that the supply period corresponding to a first pre-charge period of the k supply periods is longer than the supply period corresponding to a second pre-charge period of the k supply periods for all of the horizontal scan periods,
wherein the k supply periods are all of a same length except for the at least one of the first supply period and the last supply period.

15. A driving method for an electro-optical device including a plurality of scan lines, k signal lines, k being an integer equal to or greater than 3, a reference line to which a reference potential is applied, a pixel that is disposed corresponding to each of intersections between the plurality of scan lines and the k signal lines and that includes a holding capacitor coupled to the reference line, the pixel holding, in the holding capacitor, a potential corresponding to an image signal, an image signal circuit configured to sequentially supply the image signal to each of the k signal lines during a plurality of repeated horizontal scanning periods, and a pre-charge circuit configured to supply, in each horizontal scanning period and in a prescribed order, a pre-charge signal during a pre-charge period to a signal line of the k signal lines to which the image signal circuit has not supplied the image signal yet, the driving method comprising:
setting, in all of the horizontal scanning periods, one of a first supply period and a last supply period of the k supply periods, during which the image signal is sequentially supplied to each of the k signal lines, to be longer than one or more prescribed supply periods excluding the first supply period and the last supply period of the k supply periods,
wherein the k supply periods are all of a same length except for the at least one of the first supply period and the last supply period.

* * * * *